United States Patent
Kalio et al.

(10) Patent No.: US 11,908,966 B2
(45) Date of Patent: Feb. 20, 2024

(54) SOLAR MODULE WITH PATTERNED COVER PLATE AND OPTICAL INTERFERENCE LAYER

(71) Applicant: CNBM RESEARCH INSTITUTE FOR ADVANCED GLASS MATERIALS GROUP CO., LTD., Bengbu (CN)

(72) Inventors: Rene Kalio, Leipzig (DE); Joerg Palm, Munich (DE); Jens Kullmann, Jessen (DE); Manuel Dias, Wiesbaden (DE); Sven Ring, Berlin (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 202 days.

(21) Appl. No.: 17/263,066

(22) PCT Filed: Jul. 16, 2019

(86) PCT No.: PCT/CN2019/096226
§ 371 (c)(1),
(2) Date: Jan. 25, 2021

(87) PCT Pub. No.: WO2020/020019
PCT Pub. Date: Jan. 30, 2020

(65) Prior Publication Data
US 2021/0288203 A1    Sep. 16, 2021

(30) Foreign Application Priority Data

Jul. 27, 2018 (EP) .................................... 18186161

(51) Int. Cl.
*H01L 31/054* (2014.01)
*H02S 20/26* (2014.01)
(Continued)

(52) U.S. Cl.
CPC ............ *H01L 31/0549* (2014.12); *G02B 5/28* (2013.01); *H01L 31/0488* (2013.01); *H01L 31/18* (2013.01); *H02S 20/26* (2014.12)

(58) Field of Classification Search
CPC ..... H02S 20/26; H01L 31/0488; H01L 31/18; G02B 5/28
See application file for complete search history.

(56) References Cited

U.S. PATENT DOCUMENTS

| | | | | |
|---|---|---|---|---|
| 4,663,495 A | * | 5/1987 | Berman | .......... H01L 31/022475 |
| | | | | 180/2.2 |
| 2003/0123827 A1 | * | 7/2003 | Salerno | .................. B82Y 20/00 |
| | | | | 385/27 |

(Continued)

FOREIGN PATENT DOCUMENTS

| | | |
|---|---|---|
| CN | 1867522 A | 11/2006 |
| CN | 101246924 A | 8/2008 |

(Continued)

OTHER PUBLICATIONS

Li, et al., Journal of Materials Chemistry A, 2017, 5, 969-974 (Year: 2017).*

(Continued)

*Primary Examiner* — Sadie White
(74) *Attorney, Agent, or Firm* — Bayramoglu Law Offices LLC

(57) ABSTRACT

A solar module having on the front a cover plate with an outer surface and an inner surface is described. An optical interference layer for reflecting light within a predefined wavelength range is arranged on the inner surface. The inner surface and/or the outer surface have a patterned region. The patterned region has a height profile with hills and valleys, (Continued)

Figure 1:
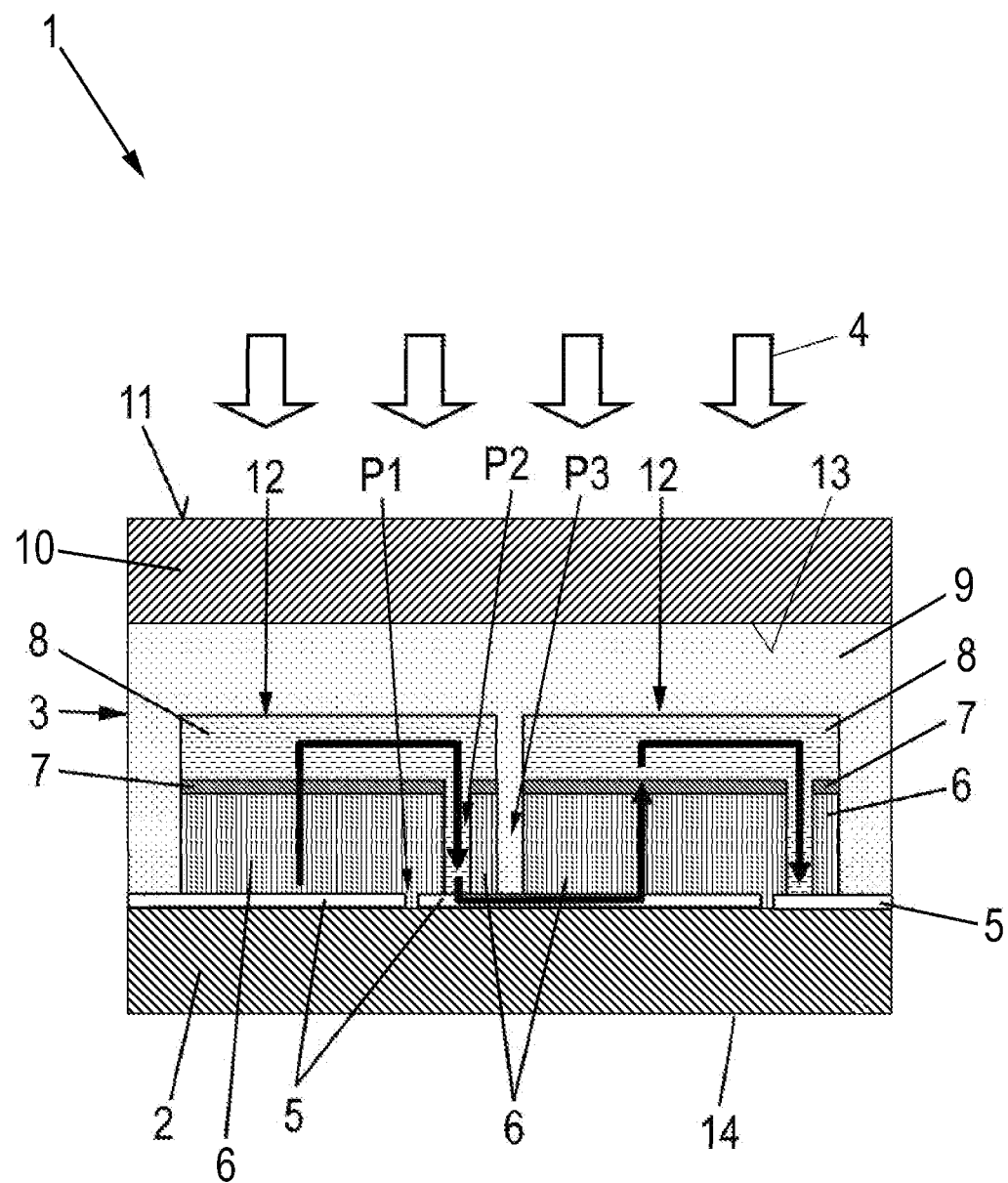

and a portion of the patterned region is composed of flat segments that are inclined relative to a plane of the cover plate.

15 Claims, 16 Drawing Sheets

(51) Int. Cl.
*G02B 5/28* (2006.01)
*H01L 31/048* (2014.01)
*H01L 31/18* (2006.01)

(56) References Cited

U.S. PATENT DOCUMENTS

| | | | |
|---|---|---|---|
| 2005/0039788 A1* | 2/2005 | Blieske | F24S 23/10 136/246 |
| 2007/0188871 A1 | 8/2007 | Fleury et al. | |
| 2007/0223095 A1 | 9/2007 | Brown | |
| 2008/0308151 A1* | 12/2008 | Den Boer | H01L 31/1884 136/256 |
| 2009/0229655 A1 | 9/2009 | Lee | |
| 2010/0037945 A1* | 2/2010 | Tsunoda | B32B 17/10348 136/256 |
| 2010/0060987 A1 | 3/2010 | Witzman et al. | |
| 2010/0065212 A1* | 3/2010 | Husemann | H01L 31/048 156/332 |
| 2010/0181014 A1 | 7/2010 | Raymond et al. | |
| 2010/0199577 A1 | 8/2010 | Sonneveld | |
| 2010/0243051 A1* | 9/2010 | Slager | G02B 5/124 136/256 |
| 2012/0006404 A1* | 1/2012 | Iizuka | H01L 31/02366 136/259 |
| 2013/0029080 A1* | 1/2013 | Chen | G02B 5/0215 428/47 |
| 2013/0081686 A1* | 4/2013 | Martinson | H01G 9/209 257/E31.124 |
| 2013/0247959 A1* | 9/2013 | Kwon | H01L 31/02366 136/246 |
| 2017/0033250 A1* | 2/2017 | Ballif | G02B 5/0278 |
| 2017/0104121 A1* | 4/2017 | O'Neill | H01L 31/0488 |
| 2017/0236962 A1 | 8/2017 | Beleznay et al. | |
| 2018/0337629 A1* | 11/2018 | Liu | H02S 40/22 |
| 2019/0097571 A1* | 3/2019 | Lefevre | H01L 31/02167 |
| 2019/0273170 A1* | 9/2019 | Sun | H01L 31/054 |

FOREIGN PATENT DOCUMENTS

| | | |
|---|---|---|
| CN | 101339961 A | 1/2009 |
| CN | 101666886 A | 3/2010 |
| CN | 101811386 A | 8/2010 |
| CN | 102356473 A | 2/2012 |
| CN | 102403380 A | 4/2012 |
| CN | 202487586 U | 10/2012 |
| CN | 203603404 U | 5/2014 |
| CN | 104395081 A | 3/2015 |
| CN | 205573193 U | 9/2016 |
| CN | 103325871 B | 12/2016 |
| EP | 0404282 A1 | 12/1990 |
| EP | 3599318 A1 | 1/2020 |
| EP | 3599647 A1 | 1/2020 |
| JP | 2002106151 A | 4/2002 |
| WO | 2011/143015 A1 | 11/2011 |
| WO | 2013/158581 A1 | 10/2013 |
| WO | 2014/045142 A1 | 3/2014 |
| WO | 2016/020797 A2 | 2/2016 |
| WO | 2020/020015 A1 | 1/2020 |
| WO | 2020/020016 A1 | 1/2020 |

OTHER PUBLICATIONS

Cho, et al., Solar Energy Materials and Solar Cells 115 (2013) 36-41 (Year: 2013).*
International Search Report and Written Opinion for International Application No. PCT/CN2019/096163 filed on Jul. 16, 2019 on behalf of CNBM Bengbu Design & Res Institute for Glass Industry Co LTD. dated Oct. 14, 2019. 8 Pages.
International Search Report and Written Opinion for International Application No. PCT/CN2019/096167 filed on Jul. 16, 2019 on behalf of CNBM Bengbu Design & Red Institute for Glass Industry Co LTD. dated Oct. 16, 2019. 10 Pages.
International Search Report and Written Opinion for International Application No. PCT/CN2019/096226 filed on Jul. 16, 2019 on behalf of CNBM Bengbu Design & Res Institute for Glass Industry Co LTD. dated Sep. 26, 2019. 8 Pages.

* cited by examiner

SOLAR MODULE WITH PATTERNED COVER PLATE AND OPTICAL INTERFERENCE LAYER

CROSS-REFERENCE TO RELATED APPLICATIONS

The present application is the U.S. National Stage of International Patent Application No. PCT/CN2019/096226 filed on Jul. 16, 2019 which, in turn, claims priority to European Patent Application No. EP 18186161.8 filed on Jul. 27, 2018.

The present invention is in the technical area of photovoltaic energy generation and relates to a solar module with a patterned cover plate and at least one optical interference layer. The invention further extends to a method for producing the solar module according to the invention as well as use thereof.

The use of solar modules as wall or façade elements is currently a market that is still economically relatively small but very interesting ecologically. In particular, in light of intensified efforts for decentralized energy solutions and energy neutral buildings, the demand for the use of solar modules as integrated components of building envelopes is increasing. Other interesting areas of application for solar modules are noise abatement walls (roadway, railway), privacy barriers in the outdoors, or walls for greenhouses. These new applications make completely new demands on solar modules, in particular in terms of aesthetics, service life, and other functionalities such as sealing and thermal insulation. In particular, the solar modules used for this would have to be available in various shapes, sizes, and colors and give the most homogeneous color impression possible. Depending on the origin of the color (absorption/re-emission, interference, refraction), the color of a per se homogeneous surface of the solar module can depend on the viewing angle and/or angle of incidence. Moreover, the spectrum and the physical distribution (diffuse, focused) of the light also determine the color impression.

These new applications make completely new demands on solar modules, in particular in terms of aesthetics, service life, and other functionalities such as sealing and thermal insulation. In particular, the solar modules used for this would have to be available in various shapes, sizes, and colors and give the most homogeneous color impression possible. However, these demands on the solar modules cause technical problems that are in conflict with the actual functionality of the solar modules, namely the most efficient possible generation of electrical power from sunlight.

An ideal solar module, in terms of efficiency optimization, would be a black body that completely absorbs the incident light in order to optimally convert the radiant energy into electrical energy. However, incident radiation is reflected from every actual body and absorbed radiation is re-emitted, with the color impression basically created in the human eye by the spectrally selected reflection and the re-emission of light. The solar spectrum has, in the visible spectral range, the highest energy intensity and the human eye has the greatest sensitivity. When a solar module is designed colored, in other words, when a color impression that differs from the ideal black body is intended to be produced in the human eye, the intensity of the light absorbed in the optically active semiconductor and thus the electrical output or the efficiency of the solar module is necessarily reduced. Optimal efficiency can, in principle, be achieved only with a black solar module. On the other hand, depending on the origin of the color (absorption/re-emission, interference, refraction), the color of a per se homogeneous surface of the solar module can depend on the viewing angle and/or angle of incidence. Moreover, the spectrum and the physical distribution (diffuse, focused) of the light also determine the color impression.

In the international patent application WO 2014/045142, multi-ply interference layers on the inner side of a front glass are described, which reflect a defined spectral range of sunlight. Such multi-ply interference layers are quite expensive to produce and thus have only limited suitability for industrial exploitation. Also presented is the optional use of a diffusely scattering cover glass, wherein the multi-ply interference layer and the roughened side of the cover glass are situated on different sides of the cover glass (multi-ply interference layer, inside; roughening, outside).

Also known is the use of bionic methods, wherein nanostructures that are similar to those of butterflies are generated (cf. Fraunhofer, Bläsi et al. 33rd European PV Solar Energy Conference and Exhibition, 24-29 Sep. 2017, Amsterdam, The Netherlands). These methods are quite complicated and cost intensive and are not yet suitable for industrial series production of large area solar modules.

Further known is the application of colors on cover glazings by ceramic screen printing or the use of organic glass colors. These are comparatively inexpensive technologies which can also generate a broad spectrum of colors. In addition, the color impression is angle-dependent only to a limited extent. However, color layers as such are, in principle, opaque and light absorbing such that the efficiency loss is unavoidably high. This is true in particular for light tones, which generally result in an unacceptable efficiency loss.

In contrast, the object of the present invention consists in making available a colored solar module, wherein the color should depend as little as possible on the viewing angle and the angle of incidence since, otherwise, with use in the building-integrated sphere, the color would strongly depend on the location of the viewer or the position of the sun. Additionally, for each color desired by the customer, the efficiency loss of the solar module should be as little as possible. For industrial series production, it is also important that the solar modules be producible on large areas as well as at acceptable costs and with satisfactory homogeneity.

These and other objects are accomplished according to the proposal of the invention by a solar module and a method for its production according to the coordinate claims. Advantageous embodiments of the invention are indicated by the features of the dependent claims.

Presented according to the invention is a solar module with solar cells electrically connected in series for photovoltaic energy generation. In principle, the solar module according to the invention can be any type of solar module, in particular, a wafer-based, silicon-based solar module or a thin-film solar module with monolithically integrated series-connected solar cells. Preferably, the solar module according to the invention is a thin-film solar module. Advantageously, the solar module is a thin-film solar module with a composite pane structure that has a front transparent cover plate and a back substrate (e.g., glass plates) that are fixedly bonded to one another by a thermoplastic or cross-linking polymer intermediate layer (e.g., PVB or EVA). The invention refers, in particular, to a thin-film solar module in substrate configuration, wherein the layer structure for producing the solar cells is applied on a surface of the back substrate facing the light-entry side. The invention equally refers to a thin-film solar module in superstrate configuration, wherein the layer structure is applied on a surface of a front transparent cover plate facing away from the light-entry side. In keeping with the customary usage, the term "thin-film solar module" refers to modules having a layer structure with a low thickness of, for example, a few microns, which require a carrier for adequate mechanical stability. The carrier can be made, for example, of inorganic glass, plastic, metal, or a metal alloy and can be designed, depending on the respective layer thickness and the specific material properties, as a rigid plate or a flexible film.

In the case of a thin-film solar module, the layer structure comprises, in a manner known per se, a back electrode layer, a front electrode layer, and a photovoltaically active absorber layer arranged between the back electrode layer and the front electrode layer. The front electrode layer is optically transparent since passage of light to the layer structure must be enabled. The optically transparent front electrode layer typically includes or is made of a doped metal oxide (TCO=transparent conductive oxide), for example, n-conductive, in particular aluminum-doped, zinc oxide (AZO).

The photovoltaically active absorber layer preferably includes or is made of a chalcopyrite semiconductor, advantageously a ternary I-III-VI-compound semiconductor from the group copper indium/gallium disulfide/diselenide (Cu(In,Ga)(S,Se)$_2$). In the above formula, indium and gallium each can be present alone or in combination. The same is true for sulfur and selenium, each of which can be present alone or in combination. Particularly suitable as material for the absorber layer is CIS (copper indium diselenide/disulfide) or CIGS (copper indium gallium diselenide, copper indium gallium disulfide, copper indium gallium disulfoselenide). The absorber layer typically has doping of a first conductor type (charge carrier type) and the front electrode has doping of the opposite conductor type. Generally speaking, the absorber layer is p-conductive (p-doped), i.e., has an excess of defect electrons (holes), and the front electrode layer is n-conductive (n-doped) such that free electrons are present in excess. A buffer layer is typically arranged between the absorber layer and the front electrode layer. This is true in particular for absorber layers based on Cu(In,Ga)(S,Se)$_2$, with which, generally speaking, a buffer layer is required between a p-conductive Cu(In,Ga)(S,Se)$_2$ absorber layer and an n-conductive front electrode. According to current understanding, the buffer layer enables electronic matching between the absorber and the front electrode. Moreover, it offers protection against sputtering damage in a subsequent process step of deposition of the front electrode, for example, by DC magnetron sputtering. By means of the succession of an n-conductive front electrode layer, a buffer layer, and a p-conductive absorber layer, a p-n-heterojunction is formed, in other words, a junction between layers of the opposite conductor type. The photovoltaically active absorber layer can also be made, for example, of cadmium telluride (CdTe) or amorphous and/or microcrystalline silicon.

In the thin-film solar module, serially connected solar cells are formed by patterning zones. Thus, at least the back electrode layer is subdivided by first patterning lines (P1-lines) into sections completely separated from one another, which sections form the back electrodes of the solar cells. Also, at least the absorber layer is subdivided by second patterning lines (P2-lines) into sections completely separated from one another, which sections form the absorbers of the solar cells, and at least the front electrode layer is subdivided by third patterning lines (P3-lines) into sections completely separated from one another, which sections form the front electrodes of the solar cells. Adjacent solar cells are electrically connected to one another in serial connection via electrically conductive material in the second patterning lines, wherein the front electrode of one solar cell is electrically connected to the back electrode of the adjacent solar cell and, typically, but not mandatorily, makes direct physical contact therewith. Each patterning zone comprises a direct succession of the three patterning lines P1-P2-P3, in this order in each case.

In keeping with the customary usage, the term "solar cell" refers to a region of the layer structure that has a front electrode, a photovoltaically active absorber, and a back electrode and is delimited by two patterning zones directly adjacent one another. This applies analogously in the edge region of the module, wherein, instead of a patterning zone, there is a connection section for electrically contacting the serial connection of the solar cells such that the solar cell is defined by the layer region with a front electrode, an absorber, and a back electrode, which is situated between a patterning zone and the directly adjacent connection section. Each solar cell has an optically active zone that comprises, arranged one atop another in the form of a stack, a back electrode, an absorber, and a front electrode and is capable of photoelectric conversion of light into electric current.

The solar module according to the invention comprises a light-entry-side or front transparent cover plate, which has an outer surface facing the external environment and an inner surface opposite the outer surface. The outer surface of the cover plate, in the installed state of the façade element in the façade, faces the external environment and forms, optionally with layers applied thereon, part of the outer side or outer surface of the façade. According to one embodiment of the invention, the cover plate is made of one and the same material, for example, glass or plastic, preferably soda lime glass. Preferably, the cover plate is a rigid glass or plastic plate. The outer surface or inner surface of the cover plate is, in this case, formed from the respective material of the cover plate. According to an alternative embodiment of the invention, the cover plate is made of at least two different materials, with the outer surface and/or the inner surface of the cover plate formed from a material different from a core of the cover plate. The core of the cover plate is preferably made of one and the same material, for example, glass or plastic, preferably soda lime glass. Applied on the core of the cover plate, on the outside and/or the inside, for example, in the form of a coating, is a material different from core of the cover plate, which is transparent and has the same optical refractive index as the material of the core of the cover plate. The outer surface or inner surface of the cover plate is, in this case, formed by the respective material that is applied on the core of the cover plate. According to the invention, the term "cover plate" also includes "composite body", provided that the materials that form the cover plate are transparent and have one and the same optical refractive index.

Preferably, the cover plate has no curvature and is thus planar (flat). The cover plate can, however, also be curved. Moreover, the cover plate can be rigid or flexible. In the form of a flexible cover plate, it can effectively be provided in planar form. In the case of a flat (planar) cover plate, the cover plate itself defines a plane, which, in the context of the present invention, means "plane of the cover plate". In the case of a curved cover plate, a local plane, which also falls under the term "plane of the cover plate", can be defined by an (imaginary) flat tangential surface at any point of the plane.

In the context of the present invention, the term "transparency" or "transparent" refers to visible-light transmittance of at least 85%, in particular at least 90%, preferably at least 95%, in particular 100%. Typically, visible-light is in the wavelength range from 380 nm to 780 nm. The term "opacity" or "opaque" refers to visible-light transmittance of less than 5%, in particular 0%. The percentage data refer to the intensity of the light measured on the module-interior side of the front cover plate, based on the intensity of the light striking the front cover plate from the external surroundings. The transparency of the cover plate can be determined in a simple manner using a measurement arrangement, wherein, for example, a white light source (source for visible light) is arranged on one side of the front cover plate and a detector for visible light is arranged on the other side of the front cover plate. The following values mentioned for the optical refractive index always refer to the optical refractive index in the visible wavelength range from 380 nm to 780 nm.

The solar module according to the invention gives the viewer, during illumination of the module outer side with white light, in particular during illumination with sunlight, a homogeneous color impression in at least one module section, in other words, the solar module is colored in the module section. Solar modules with homogeneous color impression on the entire surface are considered particularly attractive. The color of the solar module can be described by three color coordinates $L^*$, $a^*$, $b^*$, wherein the color coordinates refer to the (CIE)$L^*a^*b^*$ color space known per se to the person skilled in the art, in which all perceivable colors are defined exactly. This color space is specified in the European Standard EN ISO 11664-4 "Colorimetry—Part 4:CIE 1976 $L^*a^*b^*$ Colour Space", to which reference is made in its entirety within the present invention specification. In the (CIE)$L^*a^*b^*$ color space, each color is defined by a color location with the three Cartesian coordinates $L^*$, $a^*$, $b^*$. Green and red are opposite one another on the $a^*$-axis; the $b^*$-axis runs between blue and yellow; the $L^*$-axis describes the brightness (luminance) of the color. For a clearer representation, the values can be converted into the Lhc color space, wherein L remains the same and the saturation of the radius and h is the angle of a color point in the $a^*b^*$ plane.

The color of the solar module is based on observation of the solar module from the external environment, in other words, in viewing the front cover plate. The colorimetry or the determination of the color coordinates of the solar module can be done in a simple manner by a commercially available colorimeter (spectrophotometer). For this purpose, the spectrophotometer is pointed at the outer surface of the front cover plate, in particular placed on the outer surface. Common spectrophotometers enable standard-compliant colorimetry, with their structure and tolerances typically subject to international standards, for example, defined by DIN 5033, ISO/CIE 10527, ISO 7724, and ASTM E1347. By way of example, reference is made with regard to colorimetry to the standard DIN 5033 in its entirety. A spectrophotometer has, for example, as a light source, a xenon flash lamp, a tungsten halogen lamp, or one or a plurality of LEDs, with which the outer surface of a body is illuminated with the light (e.g., white light) generated, and light received from the solar module is measured. As explained in the introduction, the body color measured by the colorimeter results from the light reflected and re-emitted by the solar module.

In order to ensure that the solar module according to the invention has, at least in one section, a homogeneous color with relatively little angle dependence, a coloring optical interference layer for reflecting light within a predefined or pre-definable wavelength range is arranged on the inner surface of the cover plate. The optical interference layer is preferably arranged directly (without another intermediate layer) on the inner surface of the cover plate. In addition, the inner surface and/or the outer surface of the cover plate has in each case at least one patterned region, provided that either the outer surface has at least one patterned region, or (i.e., alternatively) a further optical interference layer for reflecting light within a predefined or pre-definable wavelength range is arranged on the outer surface. The optical interference layer is preferably arranged directly (without another intermediate layer) on the outer surface of the cover plate. This means that no optical interference layer is arranged on the outer surface when the outer surface has at least one patterned region. As explained below, it is common to all embodiments of the invention that the light must pass at least once through the cover plate and be reflected on the inner interference layer in order to achieve the desired chromaticity with improved angular stability.

Each optical interference layer can be single-ply or multi-ply, in other words, have one or a plurality of light-refracting plies (refraction layers). The optical interference layer serves to generate the color of the solar module, with the optical interference layer implemented such that a constructive or destructive interference of light that is reflected on the various interfaces of the optical interference layer is possible. The color of the solar module results from the interference of the light reflected on the interfaces of the optical interference layer. Upon illumination with (white) light, in particular sunlight, the optical interference layer acts as a color filter to produce a homogeneous color. The photovoltaically active solar cells, which are, for example, black-bluish (CIGS thin-film solar cells), can contribute to the overall color of the solar module.

Preferably, the patterned region of the outer surface extends over the entire cover plate, i.e., over the entire outer surface of the cover plate, such that the solar module has a homogeneous color. The solar module can also have multiple module sections each with homogeneous color. The colors of the module sections can be the same or different from one another.

The at least one patterned region has, perpendicular to the plane of the cover plate, a height profile with hills (elevations) and valleys (depressions), wherein a mean height difference between the hills and valleys is at least 2 μm and, preferably, but not mandatorily, is a maximum of 20% of a thickness of the transparent cover plate. Also, at least 50% of the patterned region of the outer surface is composed of differently inclined segments or facets. The segments are sections of the surface of the cover plate directed toward the external environment and are implemented in each case as planar surfaces that are inclined relative to the plane of the cover plate. Here, at least 20% of the segments have, with reference to the plane of the cover plate, an inclination angle in the range from greater than 0° to a maximum of 15°, and at least 30% of the segments have an inclination angle in the range from greater than 15° to a maximum of 45°. Advantageously, but not mandatorily, less than 30% of the segments have an inclination angle greater than 45°. The patterns are preferably not periodic and anisotropic. However, for special optical effects, periodic patterns and anisotropic patterns can also be used.

If the inner surface has at least one patterned region, the segments of the patterned region of the inner surface are in each case flat, have a segment area of at least 1 μm$^2$ and a mean roughness of less than 15% of a layer thickness of the optical interference layer on the inner surface. If the optical interference layer consists of multiple refraction layers, the segments of the at least one zone have in each case a mean roughness of less than 15% of a layer thickness of the refraction layer with the smallest layer thickness. The zone in which the segments each have a mean roughness of less than 15% of the layer thickness of the optical interference layer can correspond to the patterned region, i.e., the zone and the patterned region are then identical. In principle, the condition for the roughness of the segments has to be met only if an optical interference layer is arranged on a patterned region. This applies only to the at least one patterned region of the inner surface. If the outer surface has at least one patterned region, there is no requirement for the roughness of the segments of the patterned region because the outer surface either has at least one patterned region or an optical interference layer is arranged on the outer surface, but no optical interference layer is arranged on a patterned region of the outer surface.

Accordingly, for the case that the inner surface has at least one patterned region, the patterned region has a plurality of flat (planar) segments. In the context of the present invention, flat (planar) segments can be formed by non-curved surfaces. It is, however, also possible for flat (planar) segments to be formed by slightly curved surfaces. In the context of the present invention, a segment is slightly curved when the following is true for each point of the segment: if, at a point of the segment, an (imaginary) tangential plane with an area of 1 $\mu m^2$ is constructed, the distance between the surface of the segment and the tangential plane based on the normal direction relative to the tangential plane is less than 50 nm.

In the context of the present invention, the term "patterning" or "patterned region" refers to a region of the outer surface or the inner surface of the cover plate in which the features described in the immediately preceding paragraph are present in combination.

By means of the features of the patterned region, it can advantageously be ensured that upon illumination of the cover plate with light even upon viewing outside the glancing angle, light is reflected with relatively high intensity. The reason for this is the differently inclined segments that are present in sufficient number, suitable size, and suitable inclination angles to enable a high intensity of the reflected light even upon viewing outside the glancing angle. There are always enough inclined segments that scatter sufficient intensity in directions outside the glancing angle of the cover plate, by refraction on the segments in the case of a patterning on the outside and by reflection on the segments in the case of patterning on the inside.

In the glancing angle, the condition applies that the angle of incidence of the incident light corresponds to the angle of reflection of the reflected light, relative to the plane of the cover plate. As used here and in the following, the term "glancing angle" refers to the normal relative to the plane of the cover plate, in distinction from the "local glancing angle", which refers to the normal relative to the plane of a segment. Glancing angles and local glancing angles can be equal (segment is parallel to the plane of the cover plate), but are, generally speaking, different (segment is inclined relative to the plane of the cover plate).

As a result, it can be achieved that the intensity of the light not reflected in the glancing angle (i.e., scattered) is relatively high and in comparison with a reflecting surface without such a patterned region, has only little angle dependence relative to the incident direction and the viewing direction. By means of the optical interference layer, the light reflected outside the glancing angle can, depending on the refractive index and layer thickness of the optical interference layer, be subjected to a color selection such that the surface of the cover plate has a homogeneous color with relatively little angle dependence.

Advantageously in this regard, the patterned region has a height profile, in which a mean height difference between the hills and valleys is at least 2 µm, preferably at least 10 µm, and particularly preferably at least 15 µm. Such a patterned region can be produced by etching of the cover plate (e.g., cover glass). Equally advantageously in this regard, the patterned region has a height profile, in which a mean height difference between the hills and valleys is at least 50 µm, preferably at least 100 µm. Such a patterned region can be produced by rolling of the cover plate (e.g., cover glass). Accordingly, the invention advantageously extends to a solar module, of which at least one patterned region of the cover plate is produced by etching or rolling, by which means the height profiles mentioned can be produced. The patterns can, however, also be produced by applying a transparent and patterned layer on the cover plate. The layer must have the same (or at least a very similar) refractive index as the cover plate. According to the invention, the patterning of a surface of the cover plate should also include applying such a transparent and patterned layer.

Said properties of the patterned region of the cover plate can be determined by conventional measuring devices, such as a microscope, in particular a confocal microscope or stylus profilometer.

Preferably, it is ensured by means of the at least one patterned region of the (uncoated) cover plate of the solar module according to the invention that with viewing angles of 45° and 15° (in each case based on the normal relative to the plane of the cover plate) and an angle of incidence that deviates by 45° from the respective glancing angle (in both directions), a brightness L of the reflected light of at least 10 occurs. Preferably, a brightness L of the reflected light of at least 15 and more preferably at least 20 occurs. During this measurement, a black cover is mounted on the side of the (uncoated) cover plate facing away from the side to be characterized. A D65 illuminant is used for the measurement and the brightness L is measured with a commercially available multi-angle spectrophotometer (10° aperture angle). The measurement setup is explained in detail below in connection with FIG. 11. In this context, reference is made to the European standard EN ISO 11664-4 in its entirety.

The invention extends accordingly to a solar module for photovoltaic energy generation, which comprises a transparent cover plate with an outer surface facing the external environment and an opposite inner surface, wherein an optical interference layer for reflecting light within a predefined wavelength range is arranged on the inner surface, wherein the inner surface and/or the outer surface has in each case at least one patterned region, wherein either the outer surface has at least one patterned region or a further optical interference layer for reflecting light within a predefined wavelength range is arranged on the outer surface, wherein the patterned region has the following features:

perpendicular to the plane of the cover plate, a height profile having hills and valleys, wherein a mean height difference between the hills and valleys is at least 2 µm,
    at least 50% of the patterned region is composed of segments that are inclined relative to the plane of the cover plate, wherein, with reference to the plane of the cover plate, at least 20% of the segments have an inclination angle in the range from greater than 0° to a maximum of 15°, and at least 30% of the segments have an inclination angle in the range from greater than 15° to a maximum of 45°, wherein if the inner surface has at least one patterned region, the segments of the patterned region of the inner surface are in each case flat, have a segment area of at least 1 µm² and a mean roughness of less than 15% of a layer thickness of the optical interference layer on the inner surface.

Here, it is advantageous for the patterned, uncoated cover plate provided with a black back surface, to be implemented such that with a viewing angle of 45° and 15° (based in each case on the normal relative to the plane of the cover plate) and an angle of incidence that deviates by 45° from the respective glancing angle (in both directions), a brightness L of the reflected light of at least 10, at least 15, or at least 20 occurs.

The invention equally extends to a solar module for photovoltaic energy generation that comprises a transparent cover plate with an outer surface facing the external environment and an opposite inner surface, wherein an optical interference layer for reflecting light within a predefined wavelength range is arranged on the inner surface, wherein the inner surface and/or the outer surface has in each case at least one patterned region, wherein either the outer surface has at least one patterned region, or a further optical interference layer for reflecting light within a predefined wavelength range is arranged on the outer surface, wherein the uncoated cover plate provided with a black back surface and having at least one patterned region is implemented such that with a viewing angle of 45° and 15° (based in each case on the normal relative to the plane of the cover plate) and an angle of incidence that deviates by 45° from the respective glancing angle (in both directions), a brightness L of the reflected light of at least 10, at least 15, or at least 20 occurs.

According to the invention, the trade-off described in the introduction between a homogeneous color with little angle dependence and simultaneously high efficiency of the solar module can be quite satisfactorily resolved. On the one hand, as a result of the inner and/or outer patterned surface of the cover plate, light with a high intensity and little angle dependence is reflected even outside the glancing angle, since the inner interference layer constitutes an interface with a higher refractive index. With outer patterning, the light is already refracted at the air/cover plate interface and strikes the inner interference layer diffusely scattered from various angles. In the case of inner patterning alone, the diffuse scattering takes place at this inner interface since, according to the invention, many surface segments with different angles of inclination are available. On the other, as a result of the optical interference layer, it is made possible for the light to be only selectively filtered and, consequently, the remainder can strike the photovoltaically active semiconductor of the solar cells without appreciable absorption loss with high intensity such that a large share of the incident light can be converted into electrical current with high efficiency or with the least possible efficiency loss of the solar module. In addition, as a result of the coloring optical interference layer, a good homogeneous color impression is achieved. The interference layer acts as a filter with the best possible narrowband reflection and broadband transmittance.

In a preferred embodiment of the solar module according to the invention, an optical interference layer is arranged on the inner surface of the cover plate, wherein the inner surface of the cover plate has no patterned region, and the outer surface has at least one patterned region, wherein no further optical interference layer is arranged on the outer surface. The inner surface is preferably smooth (within the limits of production imprecisions). For the segments of the patterned region of the outer surface of the façade element, there is no requirement for the roughness. The patterned outer surface can even have relatively large microscopic roughness. Only transmittance, refraction, and scattering occur at this interface, but no interference. The additional layer on the outer surface can be a (for example, thin) antireflection layer whose optical refractive index is less than that of the cover plate. By this means, a substantially white reflection of the cover plate (e.g., glass plates) can be prevented, and the saturation level of the colors increases. However, an additional layer on the outer surface can also have the same refractive index as the cover plate. In this case, the layer serves only for protection of the cover plate against moisture and other corrosive components of the air. It has been found that glasses satinized by etching are more sensitive to moist heat than planar or rolled glasses. In the case of etched soda lime glass, the additional layer can be, for example, a thin sputtered $SiO_2$ layer.

In another preferred embodiment of the solar module according to the invention, an optical interference layer is arranged on the inner surface of the cover plate, wherein the inner surface of the cover plate has at least one patterned region, and the outer surface has at least one patterned region, with no further optical interference layer arranged on the outer surface. The patterned region of the inner surface and the patterned region of the outer surface can be the same or different from one another. For the segments of the patterned region of the outer surface of the façade element, there is no requirement for the roughness. The patterned outer surface can even have relatively large microscopic roughness. Only transmittance, refraction, and scattering occur at this interface, but no interference. The aforementioned requirement for roughness applies to the segments of the patterned region of the inner surface of the façade element, since an optical interference layer is arranged on the patterned region. When the outer surface is patterned and the interference layer is on the inner surface, the angular stability results from the fact that the light is refracted upon entry through the patterned outer surface on the differently inclined segments, strikes the interference layer at different angles, and, after interference and reflection, passes an additional time through the patterned outer surface while exiting from the cover plate, and changes its direction again due to refraction.

In another preferred embodiment of the solar module according to the invention, an optical interference layer is arranged on the inner surface of the cover plate, wherein the inner surface of the cover plate has at least one patterned region and the outer surface has no patterned region, with no further optical interference layer arranged on the outer surface. The outer surface is preferably smooth (within the limits of production imprecisions). The aforementioned requirement for roughness applies to the segments of the patterned region of the inner surface of the façade element since an optical interference layer is arranged on the patterned region. In this embodiment of the solar module according to the invention, it can be advantageous for the outer surface of the cover plate to be coated with a (for example, thin) antireflection layer whose index of refraction is smaller than that of the cover plate. By this means, a substantially white reflection of a, for example, glass cover plate can be prevented and the saturation level of the colors increases.

In another preferred embodiment of the solar module according to the invention, an optical interference layer is arranged on the inner surface of the cover plate, wherein the inner surface of the cover plate has at least one patterned region, and the outer surface has no patterned region, with a further optical interference layer arranged on the outer surface. The outer surface is preferably smooth (within the limits of production imprecisions). The aforementioned requirement for roughness applies to the segments of the patterned region of the inner surface of the façade element since an optical interference layer is arranged on the patterned region. The two optical interference layers can be the same or different from one another. In particular, the two optical interference layers for reflecting light can be implemented within one and the same wavelength range. However, it is also possible for the two optical interference layers for reflecting light to be implemented within different or only partially overlapping wavelength ranges. Such an upper additional layer can also be a thin antireflection layer with an index of refraction smaller than that of the cover plate. By this means, the substantially white reflection of the cover plate (e.g., glass) is prevented and the saturation level of the colors increases. However, an additional upper layer can also have the same index of refraction as the cover plate. In this case, the layer serves only for protection of the glass against moisture and other corrosive components of the air. It has been found that glasses satinized by etching are more sensitive to moist heat than planar or rolled glasses. In the case of etched soda lime glass, the additional layer can be, for example, a thin sputtered $SiO_2$ layer. It is common to all the embodiments according to the invention that the light must pass at least once through the cover plate and be reflected on the inner interference layer in order to achieve the desired chromaticity with improved angular stability.

In an advantageous embodiment of the solar module according to the invention, at least 80%, particularly preferably at least 90%, of a patterned region of the outer surface or the inner surface (depending on which surface is patterned) is composed of the segments inclined relative to the plane of the cover plate. By increasing the number of segments, the intensity of the light reflected by the patterned region of the surface of the cover plate even outside the glancing angle and its angular stability are even further increased.

In another advantageous embodiment of the solar module according to the invention, at least 30% of the segments at least of one patterned region have an inclination angle in the range from greater than 0° to a maximum of 15°; at least 40% of the segments have an inclination angle in the range from greater than 15° to a maximum of 45°, and preferably, but not mandatorily, less than 10% of the segments have an inclination angle greater than 45°. Particularly preferably, at least 40% of the segments have an inclination angle in the range from greater than 0° to a maximum of 15°; at least 50% of the segments have an inclination angle in the range from greater than 15° to a maximum of 45°; and preferably, but not mandatorily, less than 10% of the segments have an inclination angle greater than 45°. If relatively many facets with a small inclination angle of less than 15° are present, essentially only a reflected intensity at a viewing angle near the glancing angle occurs (as in the case of an unpatterned surface), which is undesirable according to the invention. With steeper facets, the angle dependence of the reflected light is reduced; however, with numerous very steep facets (greater than 45°), multiple reflections can increasingly occur, which is disadvantageous since this can result to a greater extent in the coupling of that share of the light whose reflection is desirable in the context of the present invention into the absorber layer. In addition, with many coating methods, it is difficult to ensure conforming coverage with equal layer thickness simultaneously on flat and steep surface segments. The layer thickness of the optical interference layer would thus depend on the inclination angle, again resulting in undesirable angle dependences. Most preferable in this regard is an embodiment in which the segments have in each case an inclination angle that is greater than 0° and is a maximum of 45°. In accordance with the preceding conditions, a very high intensity of reflected light can be achieved even outside the glancing angle with, at the same time, particularly little angle dependence of the intensity.

The patterns are preferably not periodic and anisotropic. However, for specific optical effects, periodic patterns and/or anisotropic patterns can also be used. Periodic and anisotropic patterns such as pyramids, tetragonal or hexagonal honeycomb patterns, or hemispheres can also be produced well with rollers during glass drawing. They can be used for attractive the gloss and color effects. When the surface patterns meet the aforementioned conditions, the solar modules in turn present a significantly reduced decrease in chromaticity for angles outside the glancing angle; however, the angle dependences are then anisotropic relative to the orientation on the module level.

The at least one optical interference layer can include one or a plurality of refraction layers and, in particular, be made thereof. A refraction layer is made of one and the same material (with the same composition) and has in particular a homogeneous (equal) refractive index over the entire layer thickness. When the optical interference layer includes multiple refraction layers, at least two refraction layers are made of a material different from one another and have a different refractive index. Advantageously, at least one refraction layer has a refractive index n greater than 1.7, preferably greater than 2.0, and particularly preferably greater than 2.3. In principle, the greater the refractive index, the lower the angle dependence of the reflected light such that the angle dependence of the color impression can be further reduced.

Advantageously, the optical interference layer contains at least one compound selected from $TiO_x$, $ZrO_x$, SiC, and $Si_3N_4$. When the optical interference layer has two, three, or more plies, the optical interference layer preferably contains at least one compound selected from $MgF_2$, $Al_2O_3$, $SiO_2$, and silicon oxynitride. These are compounds with a relatively low refractive index.

In the solar module according to the invention, due to the combination of a patterned surface with an optical interference layer, which has only a small number of refraction layers (e.g., one to three refraction layers), a good color impression can already be achieved. As a result of the small number of refraction layers, the production of the solar module is simplified and the production costs are reduced.

Advantageously, at least one optical interference layer (in particular all optical interference layers) of the solar module contains exactly one refraction layer (or is made thereof), whose refractive index n is greater than 1.9, preferably greater than 2.3.

Equally advantageously, at least one optical interference layer (in particular all optical interference layers) of the solar module contains exactly two refraction layers (or is made thereof), wherein a first refraction layer with a first refractive index n1 is present on the cover plate with a refractive index nd and a second refraction layer with a second refractive index n2 is present on the first refraction layer. For the amounts (absolute values) of the differences in the refractive indices: |n1−nd|>0.3 and |n2−n1|>0.3, and at least one of the refractive indices n1 or n2 is greater than 1.9, preferably greater than 2.3.

Equally advantageously, at least one optical interference layer (in particular all optical interference layers) of the solar module contains exactly three refraction layers (or is made thereof), wherein a first refraction layer with a first refractive index n1 is present on the cover plate with a refractive index nd, a second refraction layer with a second refractive index n2 is present on the first refraction layer, and a third refraction layer with a third refractive index n3 is present on the second refraction layer. For the amounts (absolute values) of the differences in the refractive indices: |n3−n2|>0.3 and |n2−n1|>0.3, and |n1−nd|>0.3. Here, the values of the refractive indices behave alternatingly: either n1>n2 and n3>n2 or n1<n2 and n3<n2. In addition, at least one of the refractive indices n1, n2, or n3 is greater than 1.9, preferably greater than 2.3.

As a result of the optical interference layers with exactly one, exactly two, or exactly three refraction layers, a homogeneous color impression of the solar module can be achieved with simplified production and lower production costs of the solar module. As a result of two-ply or three-ply layers, the color intensity, in other words, brightness and saturation, i.e., the reflection in a specific narrow wave range can be increased. As a result of relatively high refractive indices, the angle dependence is reduced. Interference layers made of layer stacks with more than three layers in combination with the patterned cover plate according to the invention and the embodiments presented also fall within the scope of the invention, but are more complex to produce. With a four-ply layer of refractive layers with alternating high and low refractive indices, for example, the bandwidth of the reflected light can be reduced even more with improved transmittance.

In the patterned region of the cover plate, a reflection of the incident light beam occurs with relatively high intensity even outside the glancing angle. The patterned region is, for this purpose, preferably implemented such that there is a reflection haze of more than 50%, particularly preferably more than 90%. The reflection haze can be determined by a commercially available haze meter. According to ASTM D1003, haze is the ratio of the diffuse share of reflected light to the total reflection.

As stated above, it is true for all embodiments in which the patterned side is inside and the interference layer lies directly on this patterned side that the segments should have a mean roughness of less than 15% of the layer thickness of the optical interference layer, by means of which a constructive or destructive interference of the reflected light is enabled. Advantageously, this zone extends over the entire cover plate. According to one embodiment of the invention, the patterned region has at least one other zone, i.e., (sub-) region, in which the segments have in each case a mean roughness such that interference does not occur on the optical interference layer. For example, the segments have, there, a mean roughness of 50% to 100% of the layer thickness of the interference layer. In these zones, the solar module has no color generated by the optical interference layer.

The invention further relates to a method for producing a solar module according to the invention as is described above.

The method comprises the following steps for processing the cover plate:

In a first step a), a flat transparent cover plate that has an outer surface that is intended to face the external environment and an opposite inner surface is provided.

Then, a single second step b1), b2), b3), or b4) is selected from among the following four (alternative) steps and carried out:

b1) Patterning the outer surface at least in one region and applying an optical interference layer on the inner surface. In this case, no further optical interference layer is applied on the outer surface. Also, the inner surface is not patterned.

b2) Patterning the outer surface at least in one region, patterning the inner surface at least in one region, and applying an optical interference layer on the patterned region of the inner surface. In this case, no further optical interference layer is applied on the outer surface.

b3) Patterning the inner surface at least in one region and applying an optical interference layer on the patterned region of the inner surface. In this case, no further optical interference layer is applied on the outer surface. Also, the outer surface is not patterned.

b4) Patterning the inner surface at least in one region, applying an optical interference layer on the patterned region of the inner surface, and applying a further optical interference layer on the outer surface. In this case, the outer surface is not patterned.

In the above method, the patterning of the outer surface or inner surface also includes applying a transparent layer provided with at least one patterned region on the cover plate, which forms the outer surface or inner surface.

The invention further extends to the use of the solar module according to the invention as a (an integral) component of a building envelope (building wall) or a freestanding wall, for example, a privacy wall or a noise barrier.

The various embodiments of the invention can be realized individually or in any combinations. In particular, the features mentioned above and hereinafter can be used not only in the combinations indicated but also in other combinations or in isolation without departing from the scope of the present invention.

Figure 2:
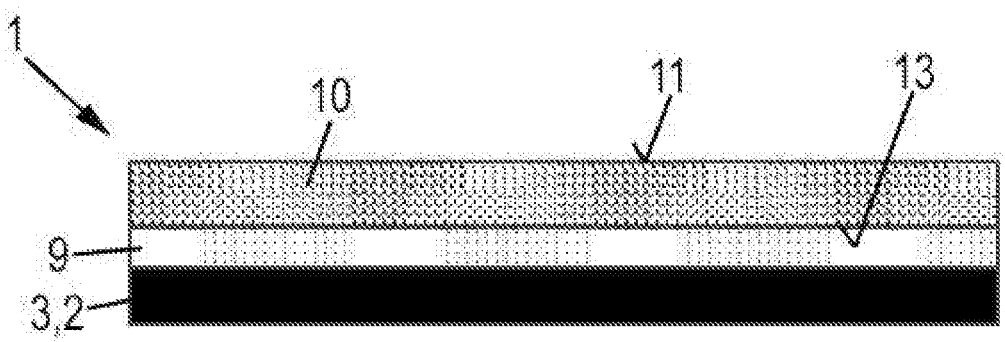
Figure 3:
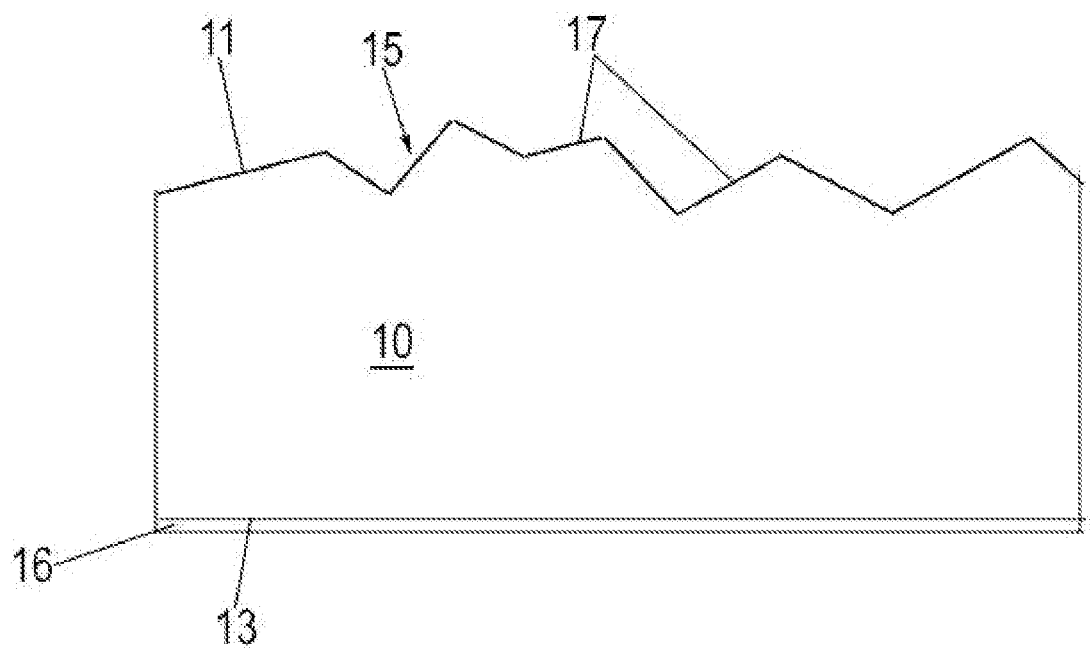
Figure 4:
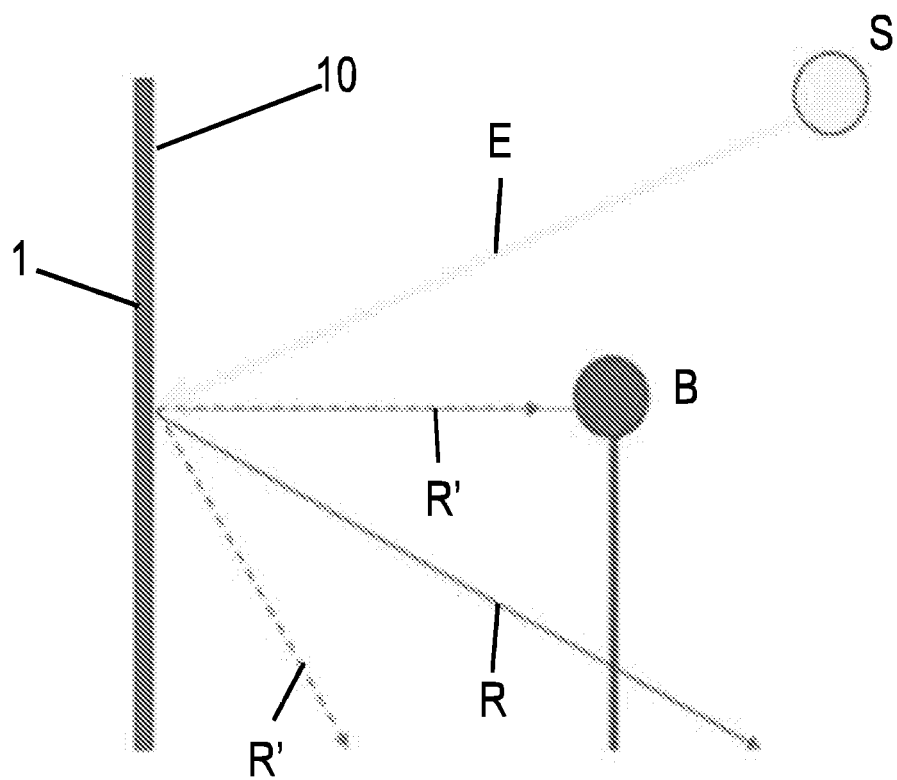
Figure 5:
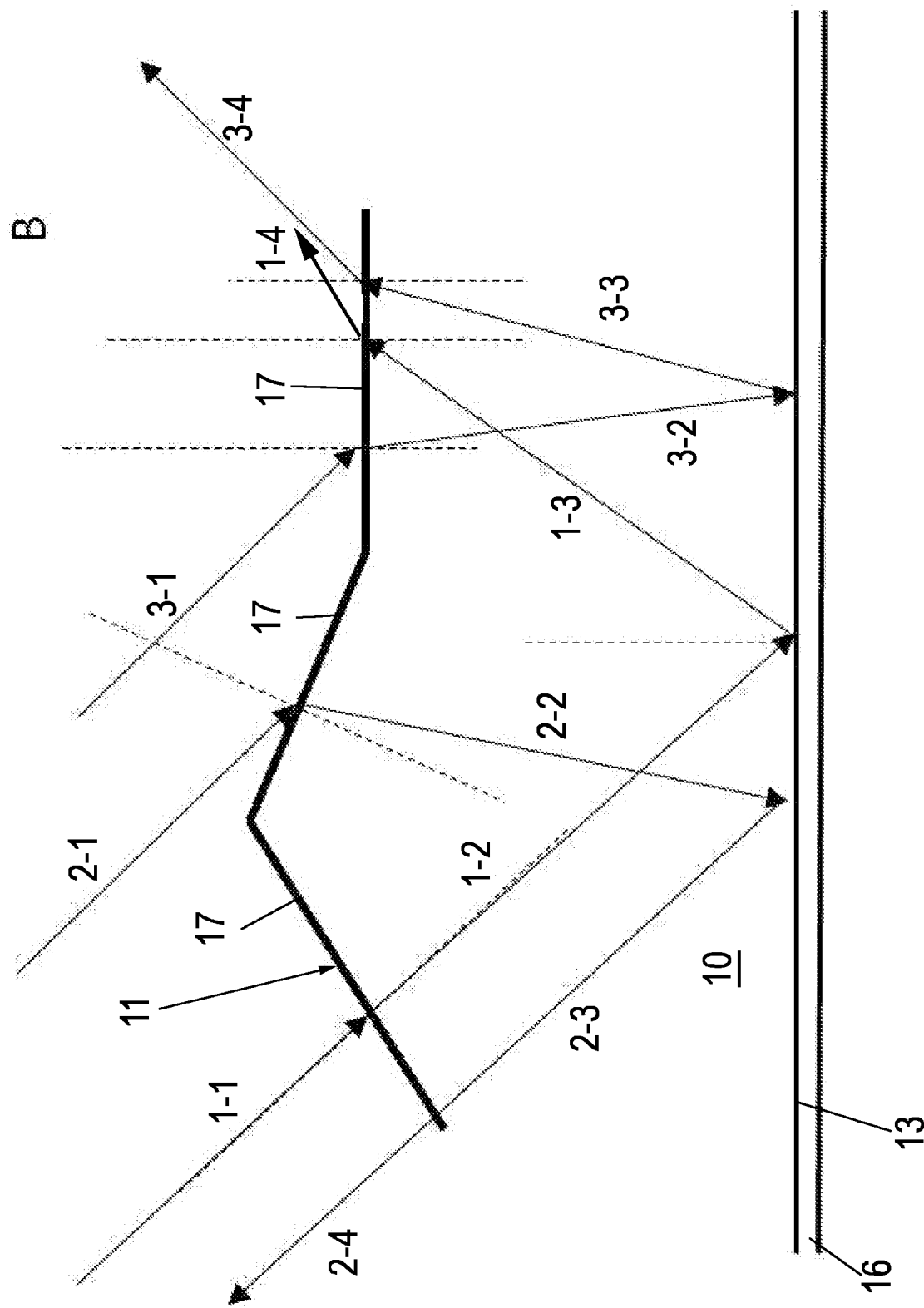
Figure 6:
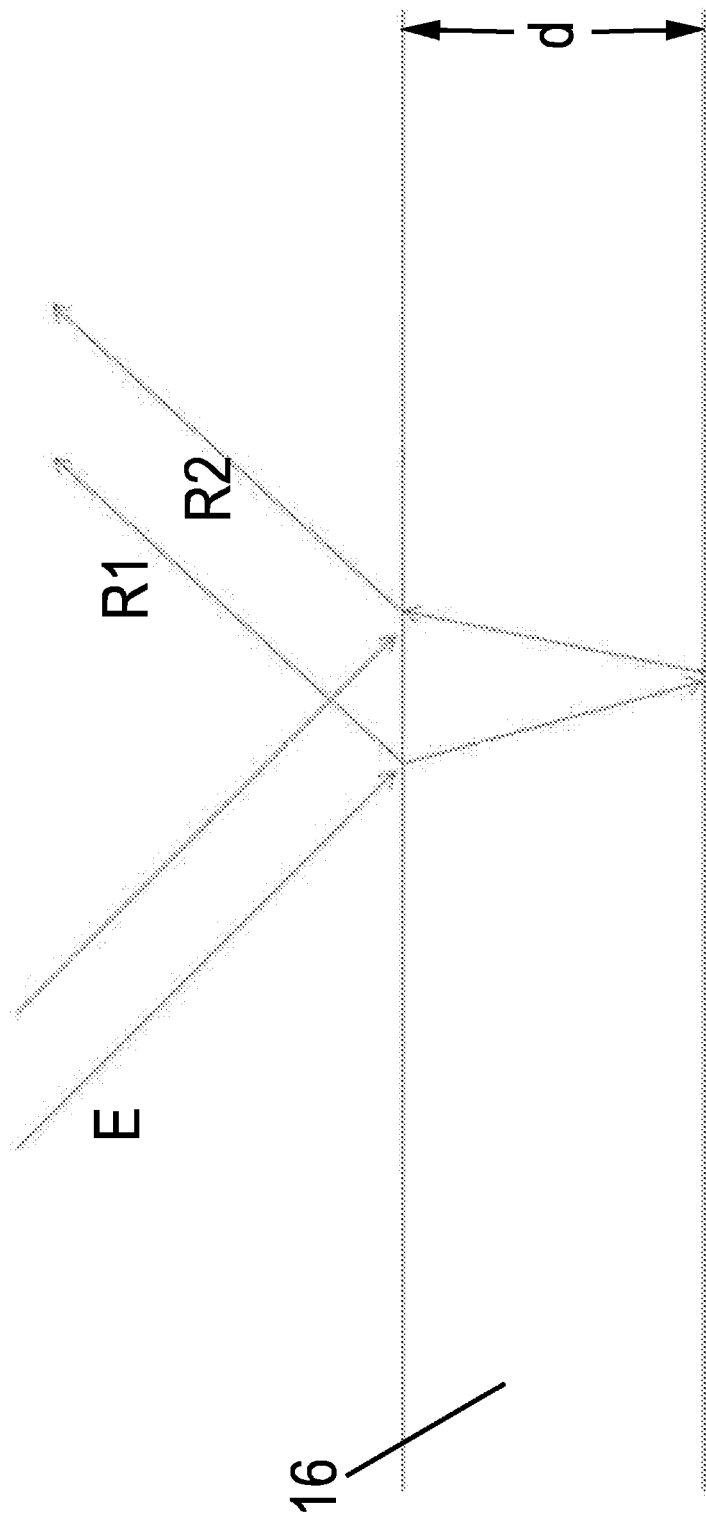
Figure 11:
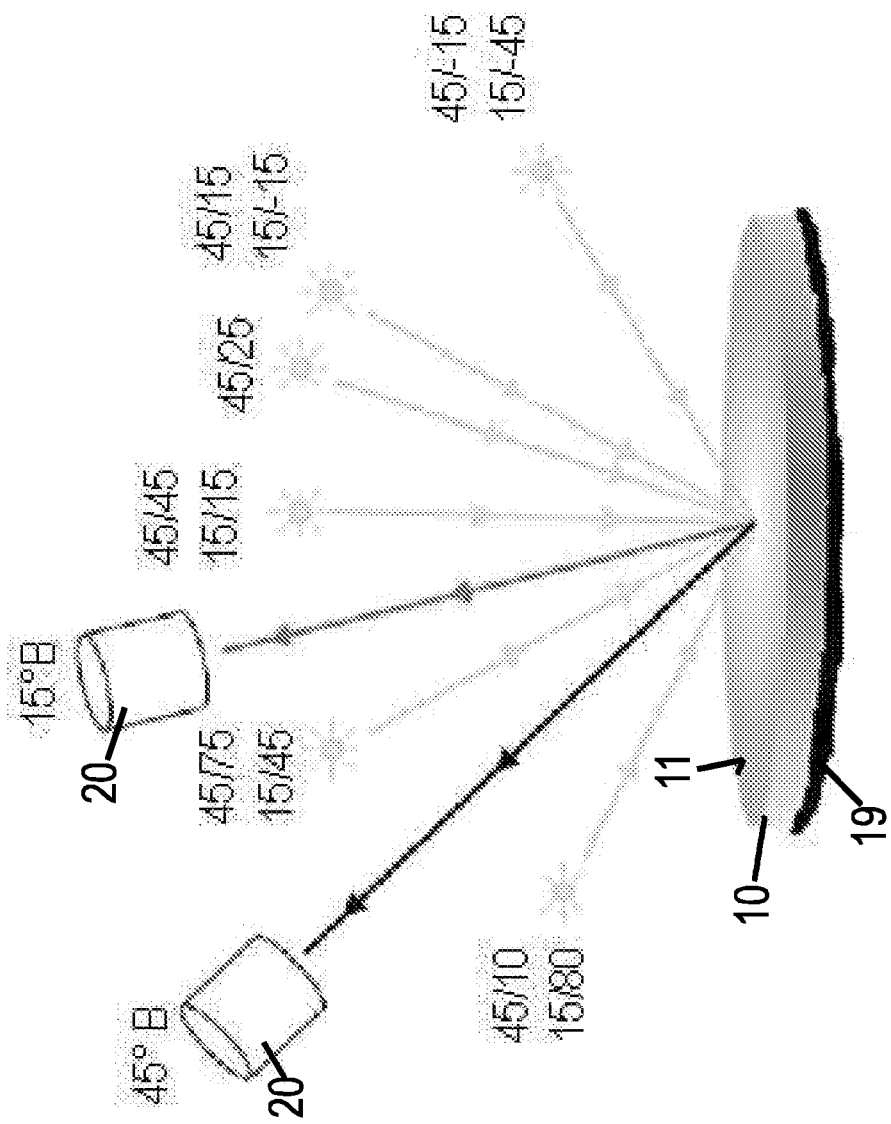
Figure 12:
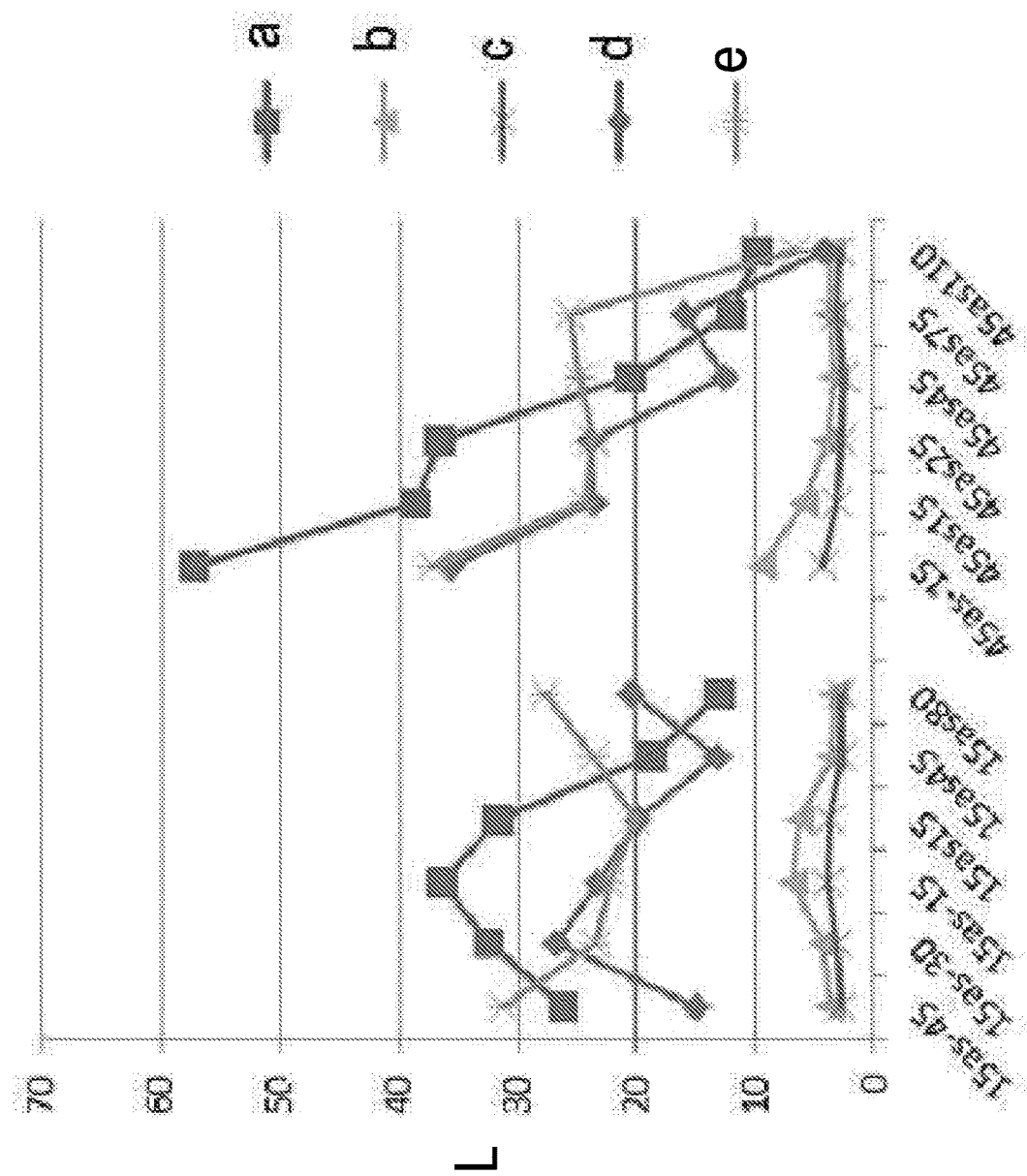
Figure 13:
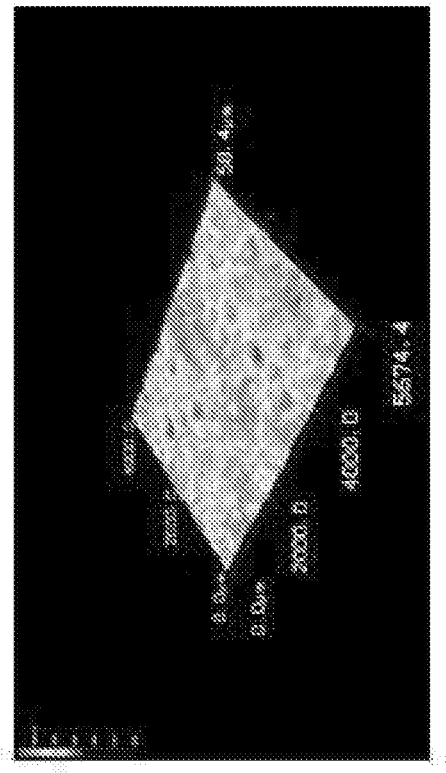
Figure 14:
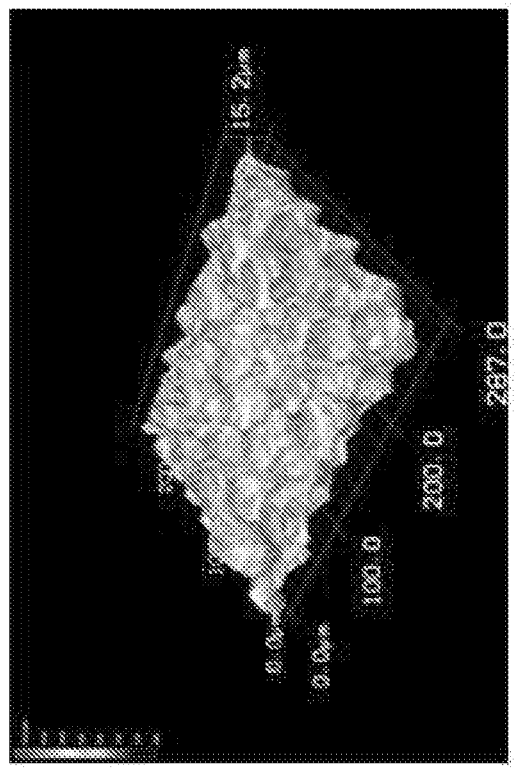
Figure 15:
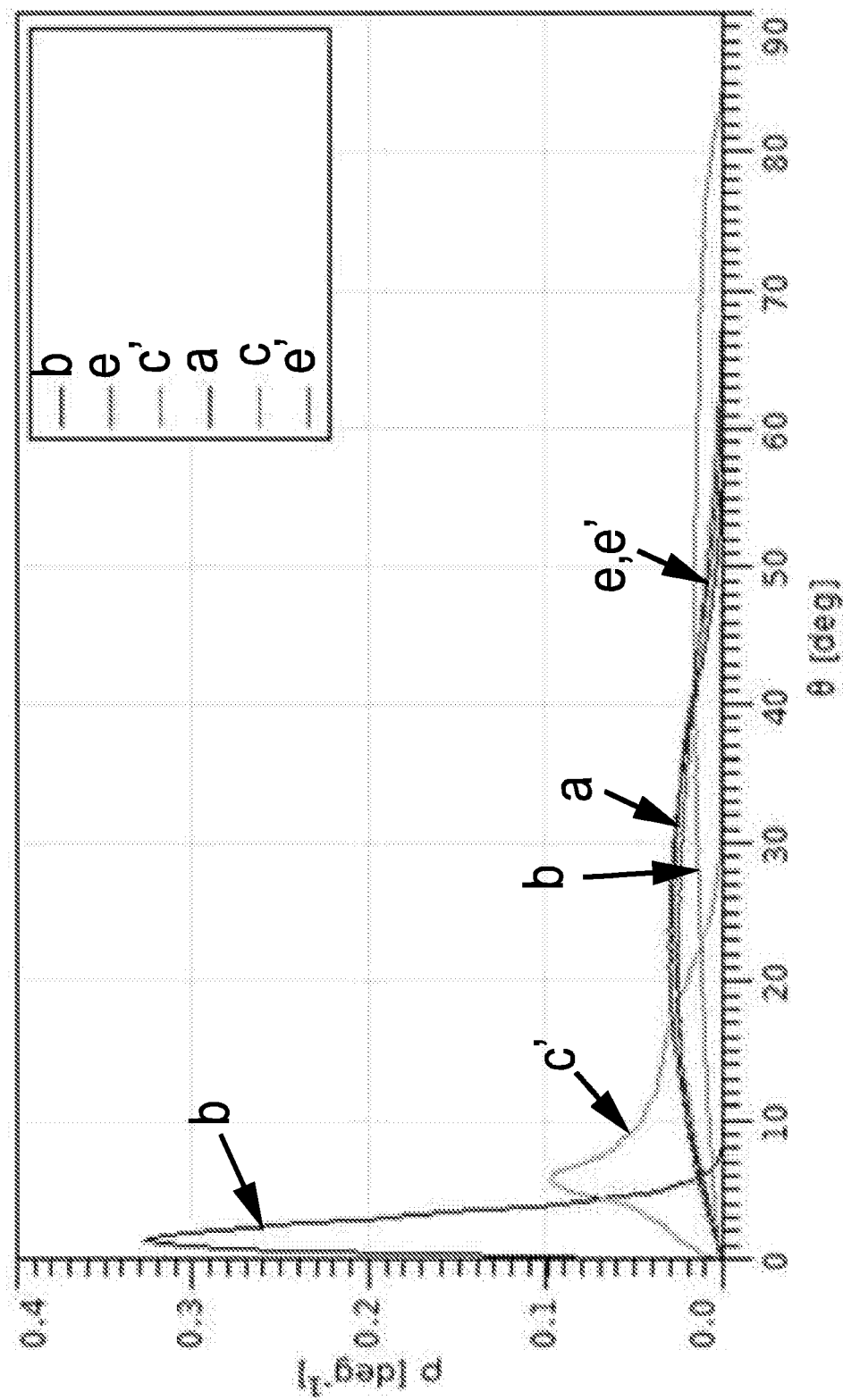
Figure 16:
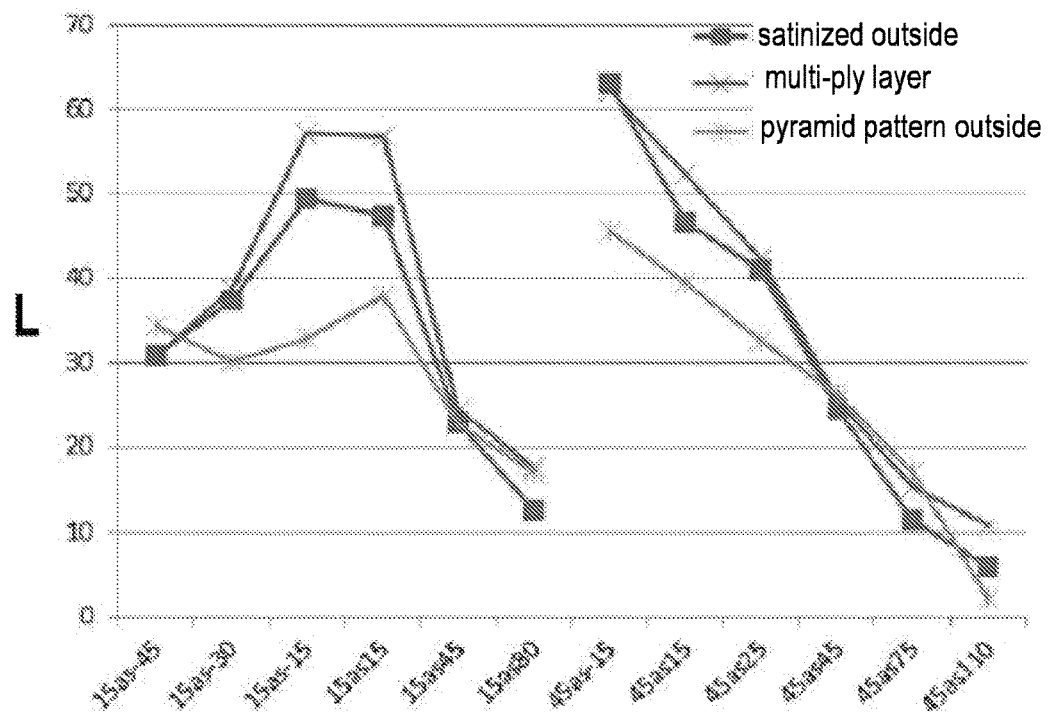
Figure 17:
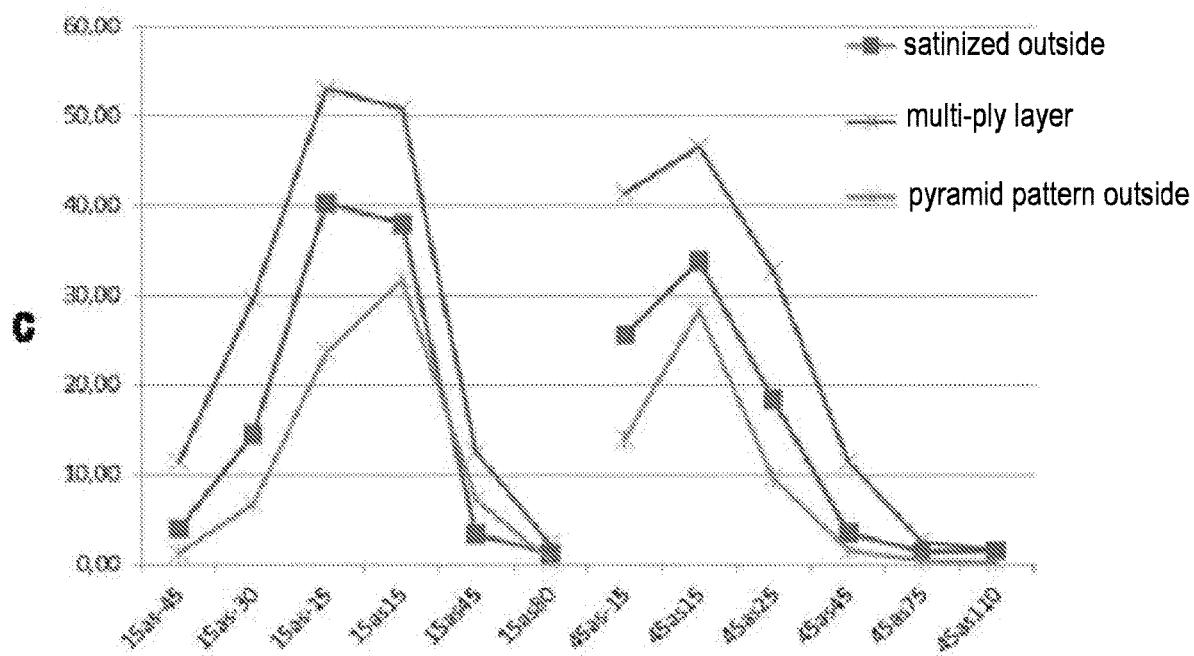
Figure 18:
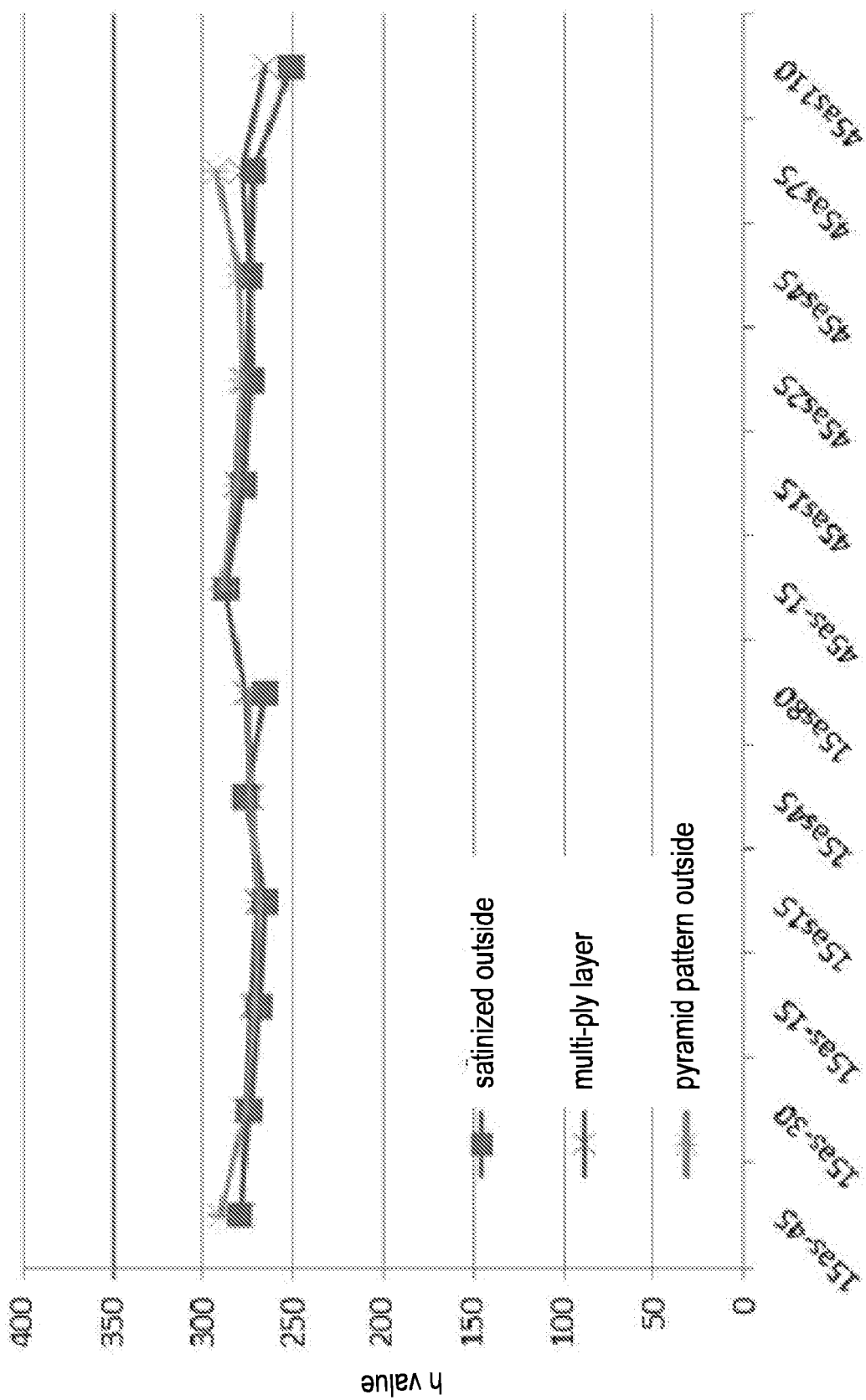
Figure 19:
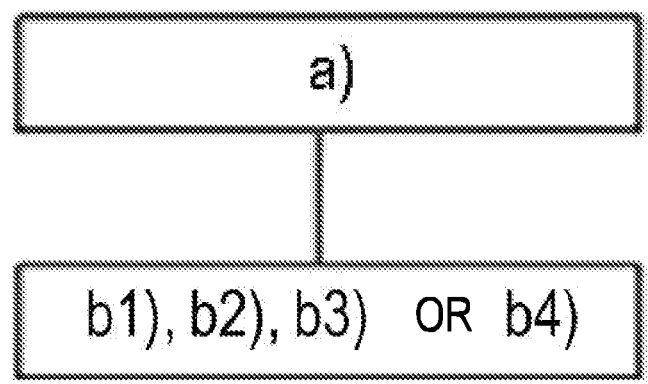

The invention is explained in detail in the following, referring to the accompanying figures. They depict, in simplified, not to scale representation:

FIG. 1 an exemplary embodiment for a solar module according to the invention in a schematic cross-section;

FIG. 2 the basic structure of the solar module according to the invention in schematic cross-section;

FIG. 3 a schematic cross-sectional view of an enlarged detail of the cover plate of FIG. 2 according to a configuration of the solar module according to the invention;

FIG. 4 a schematic representation of typical light relations of a solar module implemented as a façade element;

FIG. 5 a schematic representation of exemplary light paths during reflection in the patterned region of the cover plate of the solar module of FIG. 2;

FIG. 6 a schematic representation of the interference of light beams in the optical interference layer;

FIG. 7-10 further embodiments of the solar module according to the invention;

FIG. 11 a schematic representation of the measurement method for multi-angle colorimetry;

FIG. 12 a diagram for representing the measured values of angle-dependent measurement of the brightness of various glass panes;

FIG. 13-14 height profiles of various glass panes;

FIG. 15 a diagram for representing the angular distributions of the segments of various glass panes;

FIG. 16-18 diagram for representing various properties of patterned cover plates;

FIG. 19 a flowchart for illustrating the method according to the invention.

FIG. 1 schematically illustrates a solar module according to the present invention referenced as a whole with the number 1 using a cross-sectional view (section perpendicular to the module surface). The solar module 1 implemented by way of example in the form of a thin-film solar module comprises a plurality of solar cells 12 serially connected to one another in integrated form, of which, in a greatly simplified manner, only two are depicted. Of course, generally speaking, in the solar module 1, a large number of solar cells 12 (for example, approx. 100-150) are serially connected. The solar module 1 has a composite pane structure in substrate configuration. It comprises a back substrate 2 with a layer structure 3 made of thin films applied thereon, wherein the layer structure 3 is arranged on a light-entry-side surface of the substrate 2. The substrate 2 is implemented here, for example, as a rigid, flat glass plate with relatively high light permeability, wherein other electrically insulating materials with desired stability and inert behavior relative to the process steps carried out can equally be used.

The layer structure 3 includes, arranged on the surface of the substrate 2, an opaque back electrode layer 5 that is made, for example, of a light-impermeable metal such as molybdenum (Mo) and was applied on the substrate 2 by vapor deposition or magnetron enhanced cathodic sputtering (sputtering). The back electrode layer 5 has, for example, a layer thickness in the range from 300 nm to 600 nm. A photovoltaically active (opaque) absorber layer 6 made of a semiconductor doped with metal ions whose band gap is capable of absorbing the greatest possible share of sunlight is applied on the back electrode layer 5. The absorber layer 6 is made, for example, of a p-conductive chalcopyrite semiconductor, for example, a compound of the group $Cu(In/Ga)(S/Se)_2$, in particular sodium(Na)-doped $Cu(In/Ga)(S/Se)_2$. In the above formula, indium (In) and gallium (Ga) as well as sulfur (S) and selenium (Se) can be present optionally or in combination. The absorber layer 6 has a layer thickness that is, for example, in the range from 1-5 μm and is, in particular, approx. 2 μm. For the production of the absorber layer 6, various material layers are typically applied, for example, by sputtering, which layers are subsequently thermally converted to form the compound semiconductor by heating in a furnace, optionally in an atmosphere containing S and/or Se (RTP=rapid thermal processing). This manner of production of a compound semiconductor is well known to the person skilled in the art such that it need not be discussed in detail here. Deposited on the absorber layer 6 is a buffer layer 7, which consists here, for example, of a single layer of cadmium sulfide (CdS) and a single layer of intrinsic zinc oxide (i-ZnO), not depicted in detail in FIG. 1. A front electrode layer 8 is applied on the buffer layer 7, for example, by sputtering. The front electrode layer 8 is transparent to radiation in the visible spectral range ("window electrode") such that the incoming sunlight 4 (symbolized in FIG. 1 by arrows) is weakened only slightly. The front electrode layer 8 is based, for example, on a doped metal oxide, for example, n-conductive aluminum (Al)-doped zinc oxide (ZnO). Such a front electrode layer 8 is generally referred to as a TCO layer (TCO=transparent conductive oxide). The layer thickness of the front electrode layer 8 is, for example, approx. 500 nm. By means of the front electrode layer 8, together with the buffer layer 7 and the absorber layer 6, a heterojunction (in other words, a succession of layers of the opposite conductor type) is formed. The buffer layer 7 can effect electronic matching between the absorber layer 6 and the front electrode layer 8.

For protection against environmental influences, a (plastic) adhesive layer 9, which serves to encapsulate the layer structure 3, is applied on the layer structure 3. Glued with the adhesive layer 9 is a front or light-entry-side cover plate 10 transparent to sunlight, implemented here, for example, in the form of a rigid (planar) glass plate made of extra white glass with low iron content. The cover plate 10 is used for sealing and for mechanical protection of the layer structure 3. The cover plate 10 has an inner surface 13 facing the solar cells 12 and an outer surface 11 facing away from the solar cells 12, which is, at the same time, the module surface or the module upper side. The solar module 1 can absorb sunlight 4 via the outer surface 11 in order to produce electrical voltage on resultant voltage connections (+,−). A current path is depicted in FIG. 1 by arrows arranged in series. The cover plate 10 and the substrate 2 are fixedly bonded to one another ("laminated"), with the adhesive layer 9 implemented here, for example, as a thermoplastic adhesive layer that is plastically deformable by heating and, upon cooling, fixedly bonds the cover plate 10 and the substrate 2 to one another. The adhesive layer 9 can be provided in the production process as a laminating film and, here, is made, for example, of PVB. The cover plate 10 and the substrate 2 with the solar cells 12 embedded in the adhesive layer 9 form, together, a laminated composite. The back of the module 14 is the surface of the substrate 2 facing away from the solar cells 12.

For the formation and serial connection of the solar cells 12, the layer structure 3 is patterned using a suitable patterning technology, for example, laser scribing and/or mechanical ablation. Commonly, for this purpose, direct successions of, in each case, the three patterning lines P1-P2-P3 are introduced into the layer structure 3. Here, at least the back electrode layer 5 is subdivided by first patterning lines P1, producing the back electrodes of the solar cells 12. At least the absorber layer 6 is subdivided by second patterning lines P2, producing the photovoltaically active regions (absorbers) of the solar cells 12. At least the front electrode layer 8 is subdivided by third patterning lines P3, producing the front electrodes of the solar cells 12. By means of the second patterning line P2, the front electrode of one solar cell 12 is electrically connected to the back electrode of an adjacent solar cell 12, with the front electrode, for example, directly contacting the back electrode. In the exemplary embodiment of FIG. 1, the trenches of the first patterning lines P1 are filled by material of the absorber layer 6. The trenches of the second patterning lines P2 are filled by material of the front electrode layer 8, and the trenches of the third patterning lines P3 are filled by the adhesive layer 9. Each direct succession of a first, second, and third patterning line P1-P2-P3 forms a patterning zone for serial connection to directly adjacent solar cells 12.

Reference is now made to FIG. 2, wherein the basic structure of the solar module 1 according to the invention is depicted. The solar module 1 comprises the cover plate 10 (e.g., front glass) and the layer structure 3 applied on the back substrate 2, which are fixedly bonded to one another by the adhesive layer 9 (laminating film). The coloring element for the solar module 1 is the coated cover plate 10, whose outer surface 11 faces the incident light and whose inner surface 13 is connected to the photovoltaic solar cells 12 (silicon wafer or thin-film solar cells) via the adhesive layer 9. The solar module 1 can, in particular, be structured as described in FIG. 1. Here, the cover plate 10 is, for example, a glass pane with the least possible absorption and is made, for example, of soda lime glass. The outer surface 11 and/or the inner surface 13 of the cover plate 10 is patterned (e.g., by etching, sandblasting, or rolling during the drawing process) and has, in this case, on the inner surface 13, as well as, optionally, on the outer surface 11, an optical interference layer, which is not depicted in FIG. 1 and FIG. 2 (cf. FIG. 3).

FIG. 3 illustrates, using an enlarged detail of the cover plate 10 of the solar module 1 of FIG. 2, an embodiment of the solar module 1 according to the invention. The outer surface 11 of the cover plate 10 is patterned in a region 15, which extends, in the present example, over the entire outer surface 11, i.e., the outer surface 11 and the patterned region 15 are identical. An optical interference layer 16 is arranged directly on the inner surface 13. In the patterned region 15, the outer surface 11 is provided with a height profile that has hills and valleys. Here, more than 50% of the outer surface 11 consists of planar segments 17, whose planes are in each case inclined relative to the plane of the cover plate 10, i.e., have a non-zero angle. A mean height difference between the highest points (hills) and the lowest points (valleys) of the outer surface 11 is at least 5 µm, and is, for example, a maximum of 20% of the thickness of the transparent cover plate 10. Relative to the plane of the cover plate 10, at least 20% of the segments have an inclination angle in the range from greater than 0° to a maximum of 15°; at least 30% of the segments have an inclination angle in the range from greater than 15° to a maximum of 45°; and less than 30% of the segments 17 have an inclination angle greater than 45°. In the exemplary embodiment of FIG. 3, all segments have an inclination angle of a maximum of 45°. The optical interference layer 16 is thin, and has a layer thickness, for example, in the range from 0.1 to a few (for example, 5) micrometers. Also, the optical interference layer 16 has a refractive index n greater than 1.7, preferably greater than 2.0, and particularly preferably greater than 2.3, as well as the least possible absorption with regard to the incident light. The optical interference layer 16 can be single-ply or multi-ply, in other words, can consist of one or a plurality of refraction layers. Each refraction layer has a specific refractive index and is made of the same material. For example, the optical interference layer 16 is made of MgO, SiONx, $Si_3N_4$, $ZrO_2$, TiOx, and/or SiC. The electrical conductivity of the individual refraction layers, in particular of the optical interference layer 16, should be as low as possible.

In the following, the operating principle of the patterning of the outer surface 11 of the cover plate 10 is described in detail. Consider first FIG. 4, wherein, by way of example, typical light relations with a solar module 1 implemented as a façade element are illustrated. According to it, light from the sun S strikes directly on the cover plate 10 and is reflected in the glancing angle (angle of incidence=angle of reflection, relative to the surface normal of the plane of the cover plate). The incident light beam E and the light beam R reflected in the glancing angle are depicted. In addition to the reflected light beam R, the incident light is also scattered diffusely outside the glancing angle due to the configuration according to the invention of at least one patterned side inside or outside and the inward-positioned interference layer. Two diffusely scattered light beams R' are depicted by way of example. The color effect is produced by reflection, scattering, and interference. When a viewer B stands in front of the solar module 1 and looks directly in front of himself at a right angle to the cover plate 10, the directly reflected light R strikes his eye only in the rarest of cases (in other words, the viewer is not usually within the glancing angle).

This is illustrated in FIG. 4, where the viewer B is situated outside the glancing angle and sees only the diffusely scattered light beam R'. In the case of a cover plate without patterned regions inside or outside, the intensity of the diffusely scattered light R' is relatively low and has strong angle dependence. Only when the diffusely scattered share is adequately large is there a clear color with satisfactory intensity (brightness, L value).

Referring to FIG. 5, the function of the patterned outer surface 11 in combination with the inside interference layer 16 according to the embodiment of FIG. 3 is explained in detail. Depicted there, by way of example, are various light paths for differently inclined segments 17 of the cover plate 10. By way of example, three segments 17 are depicted, wherein the right segment 17 is parallel to the plane of the cover plate 10 and the two other segments 17 have a non-zero angle relative to the plane of the cover plate 10. The reflection of the light beams on the interference layer 16 is depicted in a simplified manner. The reflection on the interference layer 16 is explained below in connection with FIG. 6. FIG. 5 depicts the light paths for three light beams, which strike the differently inclined segments 17 of the outer surface 11 of the cover plate 10 in each case at one and the same angle relative to the normal of the plane of the cover plate 10. The respective perpendicular to the segments 17 is drawn dashed. Due to the differently inclined segments 17, the light beams are reflected differently. A first light beam 1-1 strikes a segment 17, crosses through the cover plate 10 as a refracted light beam 1-2, is reflected as light beam 1-3 by the interference layer 16 (in the glancing angle), and exits the cover plate 10 to the external environment as a refracted light beam 1-4. The light beam 1-4 ultimately reflected by the cover plate 10 has a different angle relative to the normal to the plane of the cover plate 10 than the incident light beam 1-1 such that there is no reflection in the glancing angle, but rather there is scattering. Correspondingly, a second light beam 2-1 strikes a different segment 17, crosses through the cover plate 10 as a refracted light beam 2-2, is reflected by the interference layer 16 as light beam 2-3, and exits the cover plate 10 to the external environment as a refracted light beam 2-4. The reflected light beam 2-4 exits the cover plate 10 almost opposite the incident direction of the light beam 2-1, which is likewise a scattering process and not reflection in the glancing angle. A third light beam 3-1 strikes a further segment 17, crosses through the cover plate 10 as a refracted light beam 3-2, is reflected by the interference layer 16 as light beam 3-3, and exits the cover plate 10 to the external environment as a refracted light beam 3-4. This segment 17 is parallel to the plane of the cover plate 10 such that the light beam 2-4 is reflected in the glancing angle. Essential here is the fact that as a result of those segments 17 that are inclined relative to the plane of the cover plate 10, due to the refraction on the respective segment 17 and subsequent reflection on the interface with the interference layer and further refraction on the patterned surface, overall a strong reflection even outside the glancing angle (relative to the plane of the cover plate 10) occurs such that in combination with the interference layer 16, a homogeneous color effect of the reflected light is achieved. FIG. 5 depicts, by way of example, the position of a viewer B who is situated outside the glancing angle. Due to the relatively strongly (diffusely) scattering cover plate 10 with outer patterning and an inside interference layer, there are, for various viewing angles outside the glancing angle, mostly suitable light paths that have passed through the cover plate to the inner interference layer at least once. This results in a color impression that is far less direction-dependent than is the case with prior art modules without a patterned region 15.

FIG. 6 illustrates the reflection relations on the optical interference layer 16 with layer thickness d. Depicted is a light beam E striking the interference layer 16 (after passage through the cover plate 10), which is reflected both on the interface nearer the cover plate 10 (reflected beam R1) and also on the interface (here, with the encapsulation layer) father from the cover plate 10 (reflected beam R2). If the path difference of the two light beams R1, R2 corresponds to a multiple of the wavelength of the incident light beam, constructive interference occurs (entry angle=exit angle), with a path difference of a multiple of the half wavelength, destructive interference occurs. In the case of illumination with white light, the optical interference layer acts as a color filter, since constructive interference, dependent on the refractive index n and the layer thickness d, only occurs for light of a suitable wavelength. Here, a is the angle of the reflected beams R1, R2, relative to the surface normal.

Figure 7:
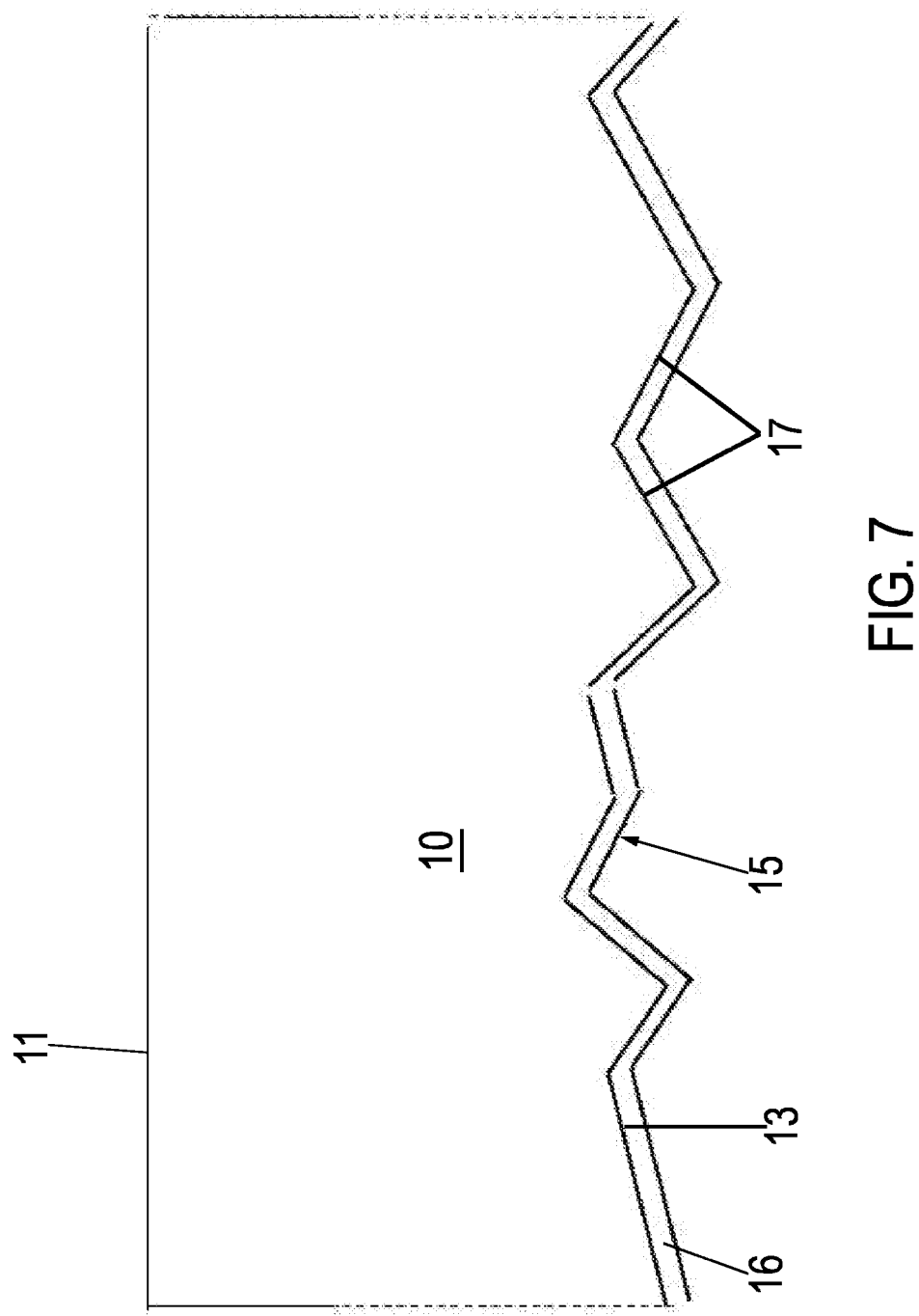

Reference is now made to FIG. 7, wherein another embodiment of the solar module 1 according to the invention is depicted. In order to avoid unnecessary repetitions, only the differences relative to the embodiment of FIG. 3 are described and, otherwise, reference is made to the statements above. Accordingly, the solar module 1 has, on the inner surface 13 of the cover plate 10, a patterned region 15 with an optical interference layer 16 arranged on the patterned region 15 (on the solar cell side).

In the patterned region 15, the inner surface 13 is provided with a height profile that has hills and valleys. Here, more than 50% of the outer surface 11 consists of planar segments 17, whose planes are in each case inclined relative to the plane of the cover plate 10, in other words, have a non-zero angle, wherein the segments are planar in each case and have a segment area of at least 1 $\mu m^2$, wherein the segments 17 have, on the inner surface 13, in each case a mean roughness of less than 15% of a layer thickness of the optical interference layer 16. The optical interference layer 16 is thin and follows the surface of the patterned region 15. The patterned region 15 and the optical interference layer 16 can in each case be implemented analogously to those of the embodiment of FIG. 3. The outer surface 11 of the cover plate 10 has no patterned region 15 and is smooth within the limits of production imprecisions. The requirement for the roughness of the segments 17 of the patterned region results from the fact that interference occurs on thin layers only when the layer thicknesses are uniform and the interfaces are adequately smooth.

Figure 8:
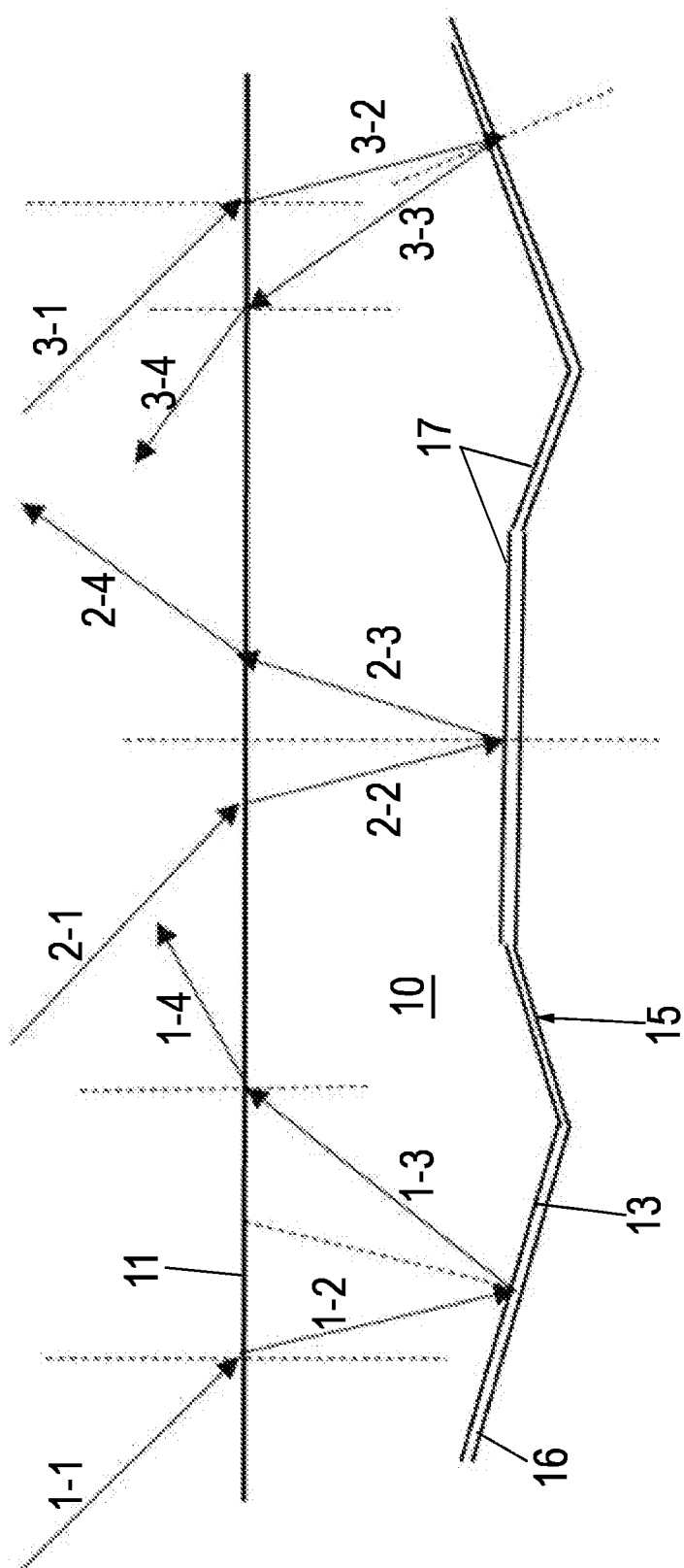

FIG. 8 depicts, analogously to FIG. 5, by way of example, three different light paths for the embodiment of the cover plate of FIG. 7. The reflection of the light beams on the interference layer 16 is again depicted in a simplified manner. The statements concerning FIG. 6 apply analogously. Due to the differently inclined segments 17, the light beams are also reflected differently by the cover plate 10. A first light beam 1-1 strikes the outer surface 11 of the cover plate 10, crosses through the cover plate 10 as a refracted light beam 1-2, is reflected by a segment 17 inclined relative to the plane of the cover plate 10 as light beam 1-3, and exits the cover plate 10 to the external environment as a refracted light beam 1-4. Correspondingly, a second light beam 2-1 strikes the outer surface 11 of the cover plate 10, crosses through the cover plate 10 as a refracted light beam 2-2, is reflected as a light beam 2-3 by a segment 17 parallel to the plane of the cover plate 10, and exits the cover plate 10 to the external environment as a refracted light beam 2-4. Correspondingly, a third light beam 3-1 strikes the outer surface 11 of the cover plate 10, crosses through the cover plate 10 as a refracted light beam 3-2, is reflected by a segment 17 inclined relative to the cover plate 10 as light beam 3-3, and exits the cover plate 10 to the external environment as a refracted light beam 3-4. Only for the center segment 17 is the condition angle of incidence=angle of reflection met for the incident light beam 2-1 and the reflected light beam 2-4, i.e., reflection in the glancing angle. The other light beams are reflected by the segments 17 in each case in the local glancing angle, which does not, however, correspond to the glancing angle of the plane of the cover plate 10 such that relatively strong scattering occurs. A homogeneous color impression for the solar module 1 can be achieved in connection with the optical interference layer 16. In this case as well, the color only occurs for angles outside the glancing angle when the light passes at least once through the cover plate all the way to the inside interference layer.

Figure 9:
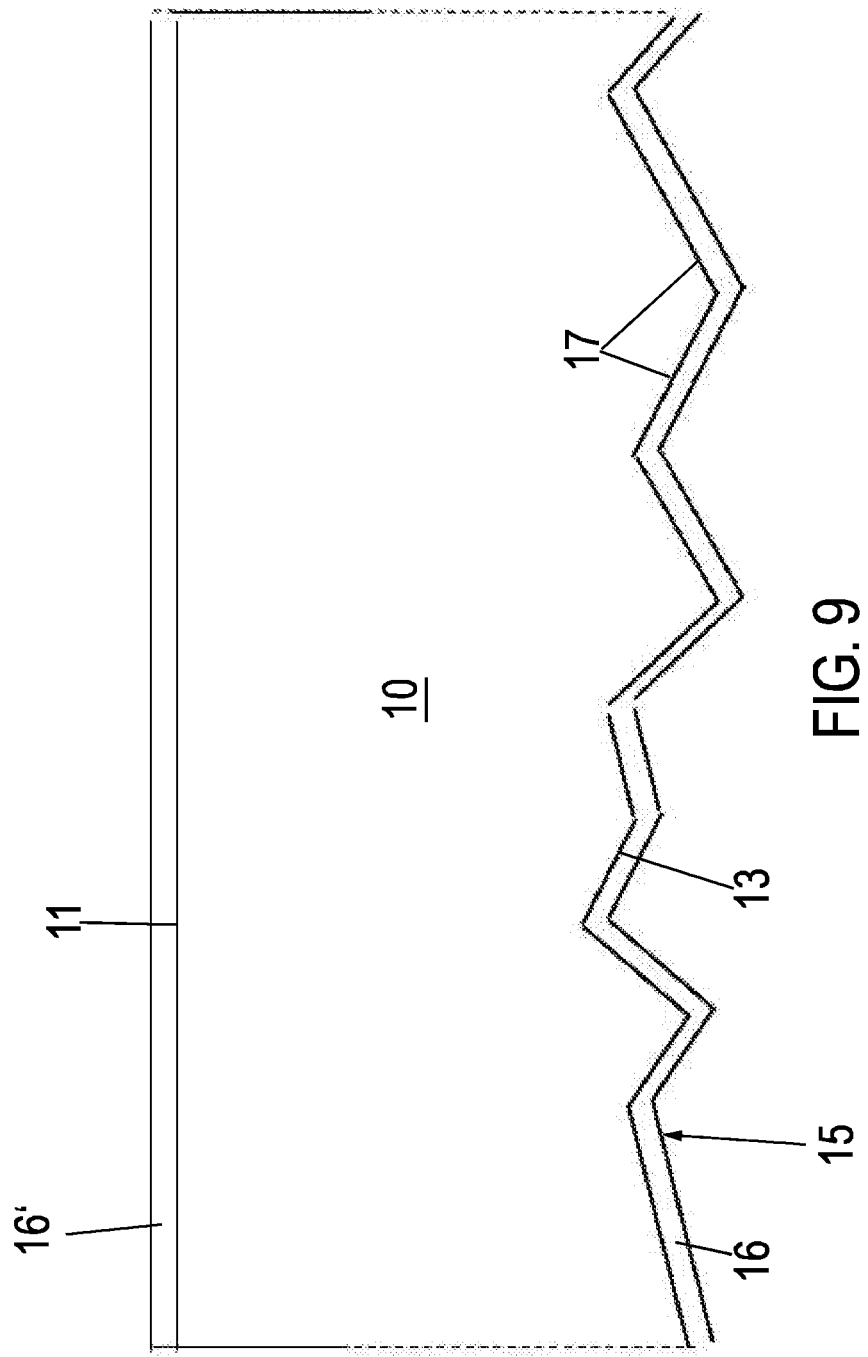

FIG. 9 illustrates another embodiment of the solar module 1 according to the invention. In order to avoid unnecessary repetitions, only the differences relative to the embodiment of FIG. 7 are described, and, otherwise, reference is made to the statements above. Accordingly, the solar module 1 has a further optical interference layer 16' directly on the outer surface 11 of the cover plate, in addition to the optical interference layer 16 on the patterned region 15 of the inner surface 11 of the cover plate 10. The outer surface 11 is not patterned, in other words, has no patterned region 15 analogously to the inner surface 13. The optical interference layer 16' has a layer thickness d' and an optical refractive index n'. The two interference layers 16, 16' have, for example, one and the same layer thickness (d=d') and one and the same refractive index (n=n'); however, the layer thickness and the refractive index need not necessarily be the same. In particular, the layer thickness and the refractive index of the two optical interference layers 16 can also be different from one another. If the same optical thickness n*d=n'*d' is selected for the two optical interference layers 16, 16', the color of the solar module 1 can be intensified since the light reaching the viewer passes through an optical interference layer a total of three times, and is, consequently, more strongly filtered. In the case of coating with significantly different optical thicknesses, mixed colors can be generated.

As a result of the coating of the outer surface 11 of the cover plate 10 with an optical interference layer 16', made of an inorganic, chemically inert, and hard layer such as with $Si_3N_4$, there is high scratch resistance, chemical stability, and dirt-repellent action for the solar module 1. In addition, a self-cleaning effect can result from the use of photocatalytic layers such as $TiO_2$. Such an additional overlaying layer can also be a thin antireflection layer with a refractive index smaller than that of the cover plate 10. Thus, the substantially white reflection of the cover plate (e.g., glass) is prevented and the saturation of the colors increases.

Figure 10:
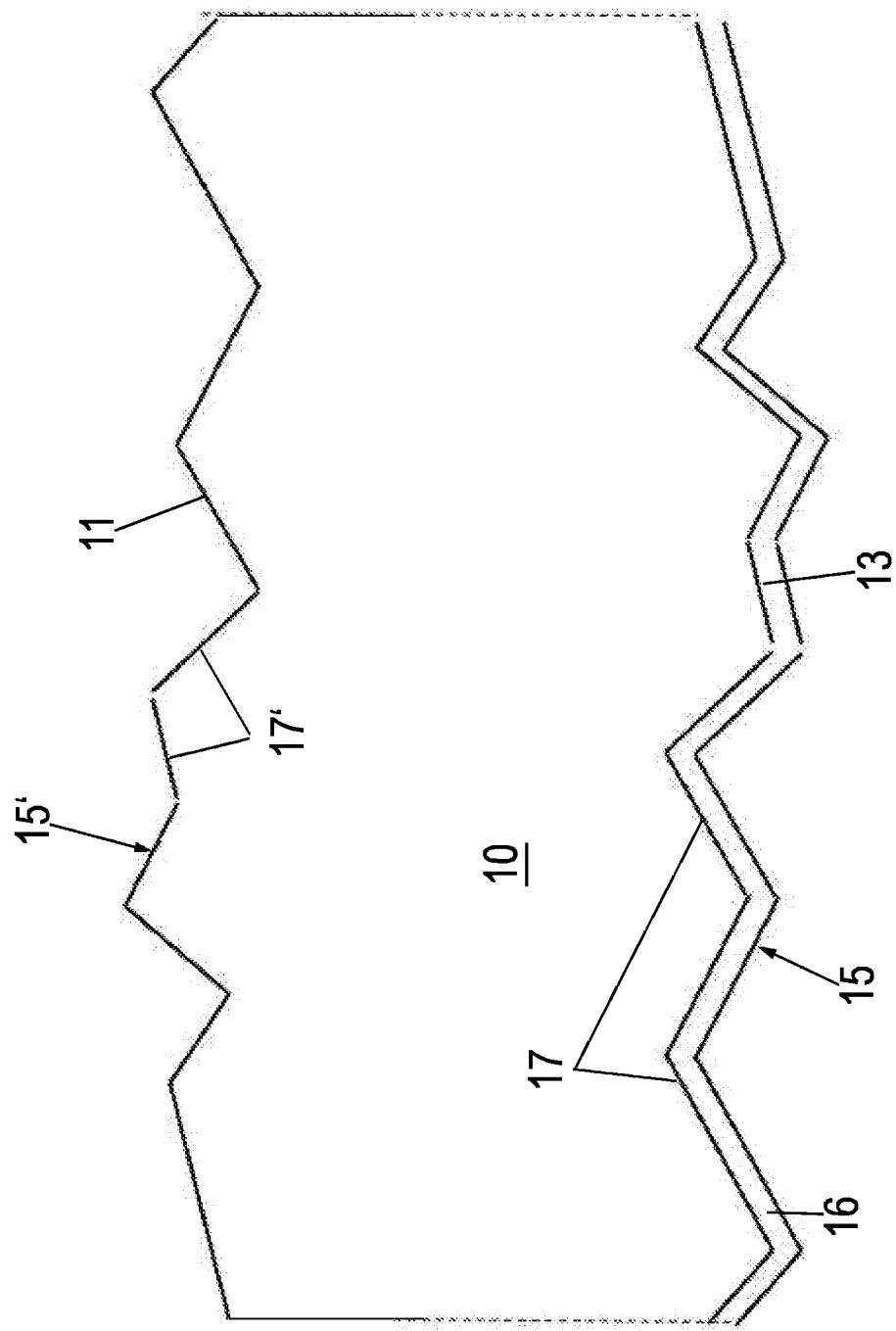

FIG. 10 illustrates another embodiment of the solar module 1 according to the invention. In order to avoid unnecessary repetitions, only the differences relative to the embodiment of FIG. 7 are described, and, otherwise, reference is made to the statements above. Accordingly, the inner surface 13 of the cover plate 10 of the solar modules 1 has a patterned region 15. In addition, the outer surface 11 of the cover plate 10 has a further patterned region 15' with segments 17'. An optical interference layer 16 is arranged only on the patterned region 15 of the inner surface 13. The two patterned regions 15 can be implemented the same or different. Both the patterned region 15 of the inner surface 13 and that of the outer surface 11 are provided with a height profile that has hills and valleys. Here, more than 50% of the inner surface 13 or of the outer surface 11 consists of flat segments 17, whose planes are in each case inclined relative to the plane of the cover plate 10, in other words, have a non-zero angle. Only for the patterned inner surface 13 do the segments 17 have in each case a segment area of at least 1 $\mu m^2$ and a mean roughness of less than 15% of the layer thickness d of the optical interference layer 16. For the segments 17' of the patterned region 15' of the outer surface 11, there is no requirement for the roughness. A mean height difference between the highest points (hills) and the lowest points (valleys) of the inner surface 13 or of the outer surface 11 is at least 2 µm, and is, for example, a maximum of 20% of the thickness of the transparent cover plate 10. Relative to the plane of the cover plate 10, at least 20% of the segments 17, 17' have an inclination angle in the range from greater than 0° to a maximum of 15°, at least 30% of the segments 17, 17' have an inclination angle in the range from greater than 15° to a maximum of 45°, and less than 30% of the segments 17, 17' have an inclination angle greater than 45°. In the exemplary embodiment of FIG. 10, all segments 17, 17' have an inclination angle of a maximum of 45°. Here as well, the light must have passed through the cover plate all the way to the inside interface layer at least once in order to reach the viewer scattered and color filtered at angles outside the glancing angle, after reflection and renewed refraction. By means of two patterned surfaces, the angular stability can be further increased compared to the embodiments in FIGS. 5, 7, and 9.

FIG. 11 depicts the measurement method for multi-angle colorimetry, wherein the diffuse scattering of the cover plate 10 not yet coated with the optical interference layer 16, which is implemented here as a glass plate, is measured with a commercially available multi-angle spectrophotometer 20 (x-rite MA-T12). The patterned region 15,15' extends over the entire outer surface 11 of the cover plate 10. A light beam of a D65 standard illuminant is aimed with various incident angles at the outer surface 11 of the cover plate 10 to be characterized, and the scattered or reflected light from various viewing angles, here, for example, 15° or 45° relative to the surface normals of the glass pane, is measured spectrally. A black, non-glossy layer 19 (e.g., attached with a liquid with a refractive index of approx. 1.5) is situated under the cover plate 10. With the multi-angle spectrophotometer 20, the brightness in the L-a-b system can be determined with D65 standard illumination and a 10° aperture angle. It has been found that there is good angular stability (low angle dependence of the scattered light), if at both 45° and 15° viewing angles and at an angle of incidence of 45°, measured in each case from the glancing angle (in both directions), at least a brightness of L=10, preferably L=15, and even better L=20 is still present. The degree data should be understood as follows: reflection angle (relative to the surface normal/angle of incidence (relative to the glancing angle). For example, with a viewing angle of 45° (measured relative to the surface normal) and an angle of incidence of 45° (measured from the glancing angle) of the incident beam strikes exactly perpendicular to the surface (45/45). With a viewing angle of 15° and an angle of incidence of 45°, the incident direction is 30° from the surface normal on the same side as the viewing direction (15/45). The multi-angle spectrophotometer 21 is positioned with a viewing angle of 45° or 15° relative to the surface normal.

FIG. 12 shows a measurement of the brightness L of various front glasses without a coloring optical interference layer, measured with a multi-angle spectrophotometer 20 as in FIG. 11. On the back side of the front glasses, a matt glass blackened on both sides was optically attached using a thin layer of glycerin (refractive index n=1.47) such that essentially the reflection of the surface is measured. Measured were a satinized glass a with a haze of 94%, a slightly textured solar glass with an antireflection layer b (solar glass, type: Albarino T) with a haze of 2%, an unpatterned float glass c with a haze<0.5%, a rolled glass d with an embossed pyramid structure (parallel), as well as a rolled glass e with an embossed pyramid structure (diagonal). The angle data correspond to those of FIG. 11, with the exception, that "I" is replaced by "as".

Obviously, the satinized front glass a and the two rolled glasses d, e present overall a significantly higher intensity of the reflected light than the solar glass b or the float glass c. The float glass c has, essentially, only one reflection in the glancing angle. In particular with angles far away from the glancing angle, significant brightness can still be discerned with the satinized glass a and the two rolled glasses d, e. Precisely this effect is advantageously used according to the present invention in combination with a coloring interference layer. As a result of the roughness of the glass, microscopic surfaces with different inclination angles are always available such that by means of the light paths of FIG. 5 (patterned surface, outside) or FIG. 8 (patterned surface, inside), the directional dependency of the color and especially of the brightness is significantly less than with coating on an unpatterned glass pane with low haze (e.g., float glass c). The patterned surface according to the invention must in each case have facets and pattern sizes in dimensions greater than the wavelength of visible light. Etched glasses are, for example, suitable for this. The patterns can, however, also be in the submillimeter range, for example, rolled glasses. Rolled patterns can also be combined with etched textures. The patterns can also be applied by deposition processes and patterning of a different transparent material on the glass. The patterns should have the most possible different surface inclinations with broad distributions of the inclination angles.

FIG. 13 shows the height profile of the slightly textured glass pane b of FIG. 12 (solar glass, type: Albarino T); FIG. 14, the height profile of the glass pane a more strongly patterned by etching of FIG. 12 (satinized glass). The height profiles were generated from measurements with a confocal microscope.

FIG. 15 shows angular distributions that were generated from the confocal microscopic measurements of FIGS. 13 and 14. Whereas with the slightly patterned glass pane b (solar glass, type: Albarino T), the segments are quite large and inclination angles of only 5-10° occur, the segments of the etched glass pane a (satinized glass) are in the range from 40 µm (hill-to-valley distance in the glass planes) with mean angles of approx. 25°. The angular distribution of the etched glass pane a is very much broader than that of the slightly patterned glass pane b. Only little intensity of the reflection (measured as an L value) is found with the slightly textured glass pane b at angles greater than 20-30° from the glancing angle. In contrast, with the satinized glass pane a, still significant brightness is seen at 45/45 or 15/45. FIG. 15 shows the angular distributions of other panes (satinized glass pane c, slightly textured solar glass c' of the type Albarino S, additional glasses e, e').

According to the invention, a clearly detectable intensification of the color effect can be achieved by at least one patterned surface of the cover plate in combination with an optical interference layer at least on the inner side of the cover plate. In contrast to this, the color effect is less and there is strong angle dependence when an optical interference layer is applied on the inner surface of an otherwise unpatterned glass pane. In general, a higher refractive index contrast results in stronger reflection and thus in stronger colors.

From the regularities for the interference on thin layers, it follows that the angle dependence of the color change is less with a higher refractive index. The following Table I shows the refraction for an optical package with an entry medium with a refractive index of 1.5 (such as glass), then an interference layer with a refractive index of 2.0 or 2.5, and then the exit medium with a refractive index of 1.5 (such as laminating film). It is clear from Table I that with an interference layer with a refractive index of 2.5 at angles up to 45° relative to the normal, there is only a slight shift of the reflection spectrum by approx. 15 nm. With the use of a material with a lower refractive index (2.0, for instance $Si_3N_4$), the angle dependence of the maximum is somewhat greater.

TABLE I

| Entry angle (°) | 0 | 45 | 70 | 0 | 45 | 70 |
| --- | --- | --- | --- | --- | --- | --- |
| Refractive index n | 2.5 | 2.5 | 2.5 | 2 | 2 | 2 |
| Thickness (nm) | 100 | 100 | 100 | 150 | 150 | 150 |
| Wavelength (1$^{st}$ max) | 417 | 402 | 396 | 412 | 362 | 320 |
| Blueshift | — | 15 | 21 | — | 50 | 92 |

The optical interference layer can be single-ply or multi-ply, with each ply formed by a refraction layer of one and the same material with a homogeneous refractive index. In particular, the optical interference layer can consist of exactly two or exactly three refraction layers. With a three-ply layer as a Bragg filter (Lambda/4 layers), for example, the width of the coloring maxima in the reflection spectrum becomes smaller and the intensity becomes stronger. With a suitable layer combination, red tones can also be produced, which are hardly possible with single layers since the higher orders always introduce too much blue or green. By means of two- and three-ply layers, the spectral range of the reflected light can be narrowed, and there are more degrees of freedom for finding the right color shade.

Already, simply through the use of 2-ply optical interference layers, the brightness and saturation of the color shade can thus be improved and the transmittance can be simultaneously optimized. Preferably, the optical interference layer is made of exactly two plies, having a first refraction layer with a first refractive index n1 inside on the cover plate with refractive index nd and a second refraction layer with a second refractive index n2 on the first refraction layer. The second refraction layer is thus adjacent the encapsulation film. The following applies to the amounts of the differences in the refractive indices: |n1−nd|>0.3 and |n2−n1|>0.3, and at least one of the refractive indices n1 or n2 is greater than 1.9, preferably greater than 2.3.

The use of 3-ply optical interference layers allows even more colors and further optimization from color shade, angle dependence, and transmittance. An optical interference layer of exactly three plies (refraction layers) can be made of two or three different materials with refractive indices n1, n2, n3, wherein there is a first refraction layer with a first refractive index n1 on the inner side of the cover plate with refractive index nd, and there is a second refraction layer with a second refractive index n2 on the first refraction layer, and there is a third refraction layer with a third refractive index n3 on the second refraction layer. The third refraction layer is thus adjacent the encapsulation film. The following applies to the amounts of the differences in the refractive indices: |n3−n2|>0.3 and |n2−n1|>0.3 and |n1−nd|>0.3. The values of the refractive indices behave alternatingly: i.e., either n1>n2 and n3>n2 or n1<n2 and n3<n2. In addition, at least one of the refractive indices n1, n2, or n3 is greater than 1.9, preferably greater than 2.3.

Results of the technical implementation of the invention in various embodiments are described in the following:

CIGS thin-film solar modules were produced. Instead of a customary front glass, coated and patterned front glasses were used. Standard front glasses have an antireflection layer and are only slightly patterned (haze=2%). Chemically etched, i.e., satinized, glasses were used as the patterned or textured glasses. The glasses had a haze of 94%. Microscopic analyses showed surface patterns with a pattern size of 20-40 μm and pattern heights of 15 μm. FIG. 14 shows the confocal microscope image of the surface of the satinized glasses used. The angles of the surface patterns (angles relative to the plane of the glass) were rather flat with typical angles around 20-40°. For the comparison, a commercially available front glass with a multi-ply interference layer on the inner side was used.

The glasses were coated on the unpatterned side with a single layer of silicon nitride ($Si_3N_4$) using magnetron sputtering. Depending on the color desired, the layers were deposited with layer thicknesses in the range of 50 nm to 250 nm. Then, they were laminated to the CIGS thin-film circuit with the patterned side outward (i.e. the side facing the sun). Used as a reference was a commercially available front glass that is made on the inside with a multi-ply layer of various materials with different refractive indices. Subsequently, the modules were characterized using a multi-angle spectrophotometer and color values were evaluated in Lhc coordinates (L=brightness, C=chromaticity or saturation, and H=hue or color shade). The multi-angle spectrophotometer has two viewing angles and 6 illumination angles in each case. The illumination angles are referenced to the glancing angle for the respective viewing angle.

FIGS. 16 to 18 show the results for L, h, and c for coating on the inside on the smooth side of glass with an outer satinized side, of glass with a rolled pyramid patterned on the outside and the multi-ply layer system (coating in each case on the inside). The axis designation "15as45" means a detection angle of 15° and an illumination angle of 45° from the glancing angle in the direction of the viewer, i.e., the angle between the illumination direction and the viewing direction is smaller than the glancing angle; "15as−45" means 45° behind the glancing angle, i.e., the angle between the illumination direction and the viewing direction is larger than the glancing angle.

It is found that for the pyramid pattern with obliquely aimed incidence, even with angles outside the glancing angle, color can still be clearly seen. The coating on the inner side with a single $Si_3N_4$ layer comes, however, very close to the multi-ply layer in terms of brightness and saturation. The angle dependence of the color shade is similar for all coatings.

In a further experiment, single layers of $Si_3N_4$ or titanium dioxide were coated onto various glasses, and the glasses were incorporated into modules, with the coating inside in each case. The modules were measured with a spectrophotometer that illuminates the surface diffusely (light type D65) and measures the color at an angle of 8° relative to the surface normal. The illumination in the glancing angle can be included (SCI) or excluded (SCE). The color values were calculated in CIE-Lab coordinates and the chromaticity (saturation) and color tone were determined therefrom. Also determined was the difference between the color with inclusion of the glancing angle and with the exclusion of the glancing angle in the color difference dE(2000). This measurement method also gives a first evaluation of angular stability.

The following Table II shows that already with single-ply layers, saturated colors and even bright color tones are obtained. The layer thicknesses were in the range from 80 nm-300 nm. As expected, with titanium dioxide, it was possible to produce even brighter and more strongly saturated color tones. With very thin layers (20-40 nm), even gray tones can be produced.

glancing exclusion. With the use of satinized glass, the brightness is increased. dE is slightly increased. When $TiO_2$ is coated on the smooth inner side of satinized glass, a significant increase in brightness and especially in saturation is obtained with a moderate dE(2000). If the patterned side is coated and the smooth side turned outward, there is a clearly higher dE; however, with glancing exclusion, brightness and saturation have even more significantly higher values than with coating on glass with a lower haze. For strong brightness and saturation, coating of a single layer of $TiO_2$ onto the smooth inner side of a pane satinized on the outside is thus shown to be very advantageous. Coating on glass satinized on both sides should, however, also be very advantageous.

TABLE III

| Description | Haze (only glass) | Coating | Configuration | Glancing | L* (D65) | a* (D65) | b* (D65) | c | h | deltaE 2000 |
|---|---|---|---|---|---|---|---|---|---|---|
| Slightly patterned glass | 2% | Si3N4 | Pattern outside, coating inside | SCI | 29.6 | −4.7 | −22.4 | 22.9 | 282 | 19.5 |
| Slightly patterned glass | 2% | Si3N4 | Pattern outside, coating inside | SCE | 10.2 | 1.4 | −3.9 | 4.1 | n.a. | |
| Pyramid rolled glass | 95% | Si3N4 | Pattern outside, coating inside | SCI | 27.2 | −0.7 | −15.8 | 15.8 | 273 | 0.8 |
| Pyramid rolled glass | 95% | Si3N4 | Pattern outside, coating inside | SCE | 26.7 | −0.6 | −14.7 | 14.7 | 272 | |
| Glass satinized one side | 94% | Si3N4 | Pattern outside, coating inside | SCI | 31.2 | −1.7 | −17.0 | 17.1 | 276 | 2.1 |
| Glass satinized one side | 94% | Si3N4 | Pattern outside, coating inside | SCE | 29.7 | −1.2 | −14.2 | 14.3 | 275 | |
| Glasses satinized one side | 94% | TiO2 | Pattern outside, coating inside | SCI | 33.1 | 3.9 | −33.5 | 33.7 | 277 | 3.2 |
| Glass satinized one side | 94% | TiO2 | Pattern outside, coating inside | SCE | 30.5 | 3.4 | −27.8 | 28.0 | 277 | |
| Glass satinized one side | 94% | TiO2 | Pattern inside, coating inside | SCI | 32.0 | 8.4 | −20.0 | 21.6 | 293 | 11.4 |
| Glasses satinized one side | 94% | TiO2 | Pattern inside, coating inside | SCE | 18.2 | 16.0 | −30.4 | 34.3 | 298 | |
| Multi-ply | n.a. | n.a. | Coating inside | SCI | 37.0 | −0.2 | −27.9 | 27.9 | 270 | 2.1 |
| Multi-ply | n.a. | n.a. | Coating inside | SCE | 34.9 | 0.0 | −25.3 | 25.3 | 270 | |

TABLE II

| | Material | Layer Thickness | Position | L | c | h |
|---|---|---|---|---|---|---|
| blue | Si3N4 | 161 | inside | 31 | 17 | 270 |
| blue | TiO2 | 125 | inside | 33 | 34 | 277 |
| green | Si3N4 | 211 | inside | 41 | 14 | 130 |
| gold | Si3N4 | 236 | inside | 38 | 16 | 73 |
| gold | TiO2 | 80 | inside | 45 | 46 | 90 |

As Table III below shows, on only slightly patterned glass, the coating yields only extremely low brightness with SCE measurement (without glancing component) and dE(2000) is very large. When $Si_3N_4$ is coated on the smooth inner side of rolled glass with a large pyramid pattern, dE(2000) is already very small and even the brightness of the color and saturation are already significantly higher with As evidence of the optimization of color and performance with unchanged angular stability, a three-ply layer $TiO_2$ (27 nm)/$Si_3N_4$ (88 nm)/$TiO_2$ (18 nm) was coated onto the smooth inner side of a satinized cover glass with the structural properties described. In comparison thereto, a single layer $TiO_2$ (125 nm) was deposited onto the smooth inner side of another cover glass. The two glasses were further processed with the coating inside to form CIGS thin-film modules. Both blue modules had comparable brightness (L=37) and saturation (c=27). The performance loss of the module with the single-ply layer was 16%, whereas the module with the three-ply layer had lost only 9% of performance.

However, the examples shown above demonstrate that already with the use of cover glass with suitable patterning and a single-ply layer, colored solar modules with various colors and good angular stability can be produced. The moderate performance loss is compensated economically with low costs by means of the comparatively simple production method.

FIG. 19 illustrates the method according to the invention for producing the solar module 1 according to the invention.

Here, for processing the cover plate, in a first step a) a planar transparent cover plate is provided, which has an outer surface that is intended to face the external environment and an opposite inner surface. Then, a single second step b1), b2) b3), or b)4 is selected from the following four (alternative) steps and carried out:

b1) Patterning the outer surface at least in one region, and applying an optical interference layer on the inner surface. In this case, no further optical interference layer is applied on the outer surface. Furthermore, the inner surface is not patterned.

b2) Patterning the outer surface at least in one region, patterning the inner surface at least in one region, and applying an optical interference layer on the patterned region of the inner surface. In this case, no further optical interference layer is applied on the outer surface.

b3) Patterning the inner surface at least in one region, and applying an optical interference layer on the patterned region of the inner surface. In this case, no further optical interference layer is applied on the outer surface. Furthermore, the outer surface is not patterned.

b4) Patterning the inner surface at least in one region, applying an optical interference layer on the patterned region of the inner surface, and applying a further optical interference layer on the outer surface. In this case, the outer surface is not patterned.

The invention makes available an improved solar module that has a very homogeneous, intense color with little or no directional dependency as well as a method for production thereof. Through the use of optical interference for color generation, significantly less efficiency loss is obtained for the underlying solar module than with the use of opaque coloring layers. This invention enables a very simple and economical method for producing colored solar modules with high efficiency and high resistance.

LIST OF REFERENCE CHARACTERS 1 solar module
2 substrate
3 layer structure
4 sunlight
5 back electrode layer
6 absorber layer
7 buffer layer
8 front electrode layer
9 adhesive layer
10 cover plate
11 outer surface
12 solar cell
13 inner surface
14 back of the module
15, 15' patterned region
16, 16' optical interference layer
17, 17' segment
19 black layer
20 multi-angle spectrophotometer

What is claimed is:

1. A solar module for photovoltaic energy generation, comprising:
   a transparent cover plate with an outer surface facing an external environment and an opposite inner surface;
   according to alternatives i) or ii):
      i) an optical interference layer for reflecting light within a predefined wavelength range is arranged on the inner surface, the inner surface and/or the outer surface having at least one patterned region, wherein either a) the outer surface has at least one patterned region, or b) another optical interference layer for reflecting light within a predefined wavelength range is arranged on the outer surface, or
      ii) an optical interference layer for reflecting light within a predefined wavelength range is arranged on the inner surface, the inner surface having at least one patterned region, and the outer surface having no patterned region, wherein no optical interference layer is arranged on the outer surface;
   the patterned region has the following features:
      perpendicularly to a plane of the cover plate, a height profile with hills and valleys, wherein a mean height difference between the hills and valleys is at least 2 µm, and
      at least 50% of the at least one patterned region of the alternatives i) or ii) is composed of segments that are inclined relative to the plane of the cover plate, wherein, with reference to the plane of the cover plate, at least 20% of the segments have an inclination angle in a range from greater than 0° to 15°, and at least 30% of the segments have an inclination angle in a range from greater than 15° to 45°;
   if the inner surface has at least one patterned region, the segments of the patterned region of the inner surface are planar, and have a segment area of at least 1 µm$^2$ and a mean roughness of less than 15% of a layer thickness of the optical interference layer on the inner surface; wherein the patterned region has a reflection haze of more than 50%, wherein the cover plate is configured such that, when provided with a black inner surface and illuminated on an illuminated surface opposite the black inner surface at an angle of incidence that deviates by 45° from a glancing angle of the illuminated surface, a brightness L of a reflected light with a color effect is observed at viewing angles of 45° and 15°, wherein the viewing angles are based on a normal relative to the cover plate, L being selected from the group consisting of at least 10, at least 15, and at least 20.

2. The solar module according to claim 1, wherein in alternative i) the inner surface of the cover plate has no patterned region and the outer surface has at least one patterned region, wherein no optical interference layer is arranged on the outer surface.

3. The solar module according to claim 1, wherein in alternative i) the inner surface of the cover plate has at least one patterned region, and the outer surface has at least one patterned region, wherein no optical interference layer is arranged on the outer surface.

4. The solar module according to claim 1, wherein in alternative i) the inner surface of the cover plate has at least one patterned region, and the outer surface has no patterned region, wherein another optical interference layer is arranged on the outer surface.

5. The solar module according to claim 1, wherein at least one optical interference layer includes a single refraction layer having a refractive index n selected from the group consisting of greater than 1.7, greater than 2.0, or greater than 2.3.

6. The solar module according to claim 1, wherein at least one optical interference layer includes exactly two refraction layers, and wherein
   a first refraction layer with a first refractive index n1 is arranged on the cover plate with a refractive index nd with |n1−nd|>0.3,
   a second refraction layer with a second refractive index n2 is arranged on the first refraction layer with |n2−n1|>0.3, and
   at least one of the refractive indices n1 or n2 is greater than 1.9 or greater than 2.3.

7. The solar module according to claim 1, wherein at least one optical interference layer includes exactly three refraction layers, and wherein
   a first refraction layer with a first refractive index n1 is arranged on the cover plate with a refractive index nd with |n1−nd|>0.3,
   a second refraction layer with a second refractive index n2 is arranged on the first refraction layer with |n2−n1|>0.3,
   a third refraction layer with a third refractive index n3 is arranged on the second refraction layer with |n3−n2|>0.3,
   at least one of the refractive indices n1, n2, or n3 is greater than 1.9 or greater than 2.3, and
   (i) n1>n2 and n3>n2, or (ii) n1<n2 and n3<n2.

8. The solar module according to claim 1, wherein at least 80% of a patterned region is composed of segments inclined relative to the plane of the cover plate.

9. The solar module according to claim 1, wherein
   i) at least 30% of the segments have an inclination angle in a range from greater than 0° to 15°, at least 40% of the segments have an inclination angle in a range from greater than 15° to 45°, and less than 10% of the segments have an inclination angle greater than 45°, or
   ii) at least 40% of the segments have an inclination angle in a range from greater than 0° to 15°, at least 50% of the segments have an inclination angle in a range from greater than 15° to 45°, and less than 10% of the segments have an inclination angle greater than 45°.

10. The solar module according to claim 1, wherein at least one optical interference layer contains at least one compound selected from the group consisting of $TiO_x$, $ZrO_x$, SiC, and $Si_3N_4$.

11. The solar module according to claim 1, wherein the cover plate has a reflection haze of more than 90%.

12. A method for producing the solar module according to claim 1, comprising:
   a) providing a transparent cover plate with an outer surface, adapted to face an external environment, and an opposite inner surface;
   b) in case of alternative i) of claim 1, performing b1), b2) or b3) being:
      b1) patterning the outer surface at least in one region and applying an optical interference layer on the inner surface,
      b2) patterning the outer surface at least in one region, patterning the inner surface at least in one region, and applying an optical interference layer on the patterned region of the inner surface,
      b3) patterning the inner surface at least in one region, applying an optical interference layer on the patterned region of the inner surface, and applying a further optical interference layer on the outer surface;
   c) alternatively to b), in case of alternative ii) of claim 1, performing c1) being:
      c1) patterning the inner surface at least in one region and applying an optical interference layer on the patterned region of the inner surface, wherein the outer surface is not patterned and no optical interference layer is applied on the outer surface.

13. A building envelope or a freestanding wall having an integrated component, the integrated component comprising the solar module according to claim 1.

14. The building envelope or freestanding wall of claim 13, wherein the integrated component is selected from the group consisting of a window, a façade, and a roof element.

15. A solar module for photovoltaic energy generation, comprising:
   a transparent cover plate with an outer surface facing an external environment and an opposite inner surface;
   according to alternatives i) or ii):
      i) an optical interference layer for reflecting light within a predefined wavelength range is arranged on the inner surface, the inner surface and/or the outer surface having at least one patterned region, wherein either a) the outer surface has at least one patterned region, or b) another optical interference layer for reflecting light within a predefined wavelength range is arranged on the outer surface, or
      ii) an optical interference layer for reflecting light within a predefined wavelength range is arranged on the inner surface, the inner surface having at least one patterned region, and the outer surface having no patterned region, wherein no optical interference layer is arranged on the outer surface;
   the patterned region has the following features:
      perpendicularly to a plane of the cover plate, a height profile with hills and valleys, wherein a mean height difference between the hills and valleys is at least 50 μm or at least 100 μm, and
      at least 50% of the at least one patterned region of the alternatives i) or ii) is composed of segments that are inclined relative to the plane of the cover plate, wherein, with reference to the plane of the cover plate, at least 20% of the segments have an inclination angle in a range from greater than 0° to 15°, and at least 30% of the segments have an inclination angle in a range from greater than 15° to 45°;
   if the inner surface has at least one patterned region, the segments of the patterned region of the inner surface are planar, and have a segment area of at least 1 μm² and a mean roughness of less than 15% of a layer thickness of the optical interference layer on the inner surface; wherein the patterned region has a reflection haze of more than 50%, wherein the cover plate is configured such that, when provided with a black inner surface and illuminated on an illuminated surface opposite the black inner surface at an angle of incidence that deviates by 45° from a glancing angle of the illuminated surface, a brightness L of a reflected light with a color effect is observed at viewing angles of 45° and 15°, wherein the viewing angles are based on a normal relative to the cover plate, L being selected from the group consisting of at least 10, at least 15, and at least 20.

* * * * *